US012763155B2

(12) United States Patent
Song et al.

(10) Patent No.: US 12,763,155 B2
(45) Date of Patent: Oct. 13, 2026

(54) ERASE SATURATION MITIGATION IN NON-VOLATILE MEMORY

(71) Applicant: Sandisk Technologies, Inc., Milpitas, CA (US)

(72) Inventors: Yi Song, San Jose, CA (US); Jiahui Yuan, Fremont, CA (US); Jiacen Guo, Sunnyvale, CA (US); Xiang Yang, Santa Clara, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 571 days.

(21) Appl. No.: 18/360,075

(22) Filed: Jul. 27, 2023

(65) Prior Publication Data

US 2024/0379175 A1 Nov. 14, 2024

Related U.S. Application Data

(60) Provisional application No. 63/500,728, filed on May 8, 2023.

(51) Int. Cl.
*G11C 16/34* (2006.01)
*G11C 16/16* (2006.01)

(52) U.S. Cl.
CPC .......... *G11C 16/3445* (2013.01); *G11C 16/16* (2013.01); *G11C 16/3404* (2013.01)

(58) Field of Classification Search
CPC . G11C 16/3445; G11C 16/16; G11C 16/3404; G11C 11/5628; G11C 11/5635; G11C 16/0483; G11C 16/08; G11C 16/10; G11C 16/24
See application file for complete search history.

(56) References Cited

U.S. PATENT DOCUMENTS

| | | | | |
|---|---|---|---|---|
| 6,438,037 | B1 * | 8/2002 | Fastow .............. | G11C 16/3404 365/185.22 |
| 6,483,751 | B2 * | 11/2002 | Chen .................. | G11C 16/3409 365/185.26 |
| 6,788,580 | B2 | 9/2004 | Takahashi | |
| 7,558,122 | B2 | 7/2009 | Kim et al. | |
| 7,668,019 | B2 | 2/2010 | Byeon | |
| 7,911,849 | B2 | 3/2011 | Hemink | |
| 8,830,756 | B2 | 9/2014 | Mu et al. | |
| RE45,699 | E | 9/2015 | Lutze et al. | |

(Continued)

*Primary Examiner* — Jay W. Radke
(74) *Attorney, Agent, or Firm* — Pearl Cohen LLP

(57) ABSTRACT

Technology is disclosed herein for a storage system that mitigates erase saturation when erasing memory cells. If erase does not pass after a number of erase loops, the storage system applies a program pulse to memory cells on faster to erase NAND strings. However, memory cells on slower to erase NAND strings are inhibited from programming. The program pulse increases the Vt of memory cells on the faster to erase NAND strings. Then, another erase loop is performed. The process may continue with additional loops, with each loop programming the memory cells on the faster to erase NAND strings followed by an erase pulse to all NAND strings and erase verify. Over-erase of the memory cells on the faster to erase NAND strings is therefore prevented. Moreover, slower to erase NAND strings that may otherwise be a bottleneck do not prevent successful completion of the erase.

20 Claims, 20 Drawing Sheets

(56) References Cited

U.S. PATENT DOCUMENTS

| | | | | |
|---|---|---|---|---|
| 2001/0043492 | A1* | 11/2001 | Lee | G11C 16/3468 365/185.29 |
| 2002/0133679 | A1* | 9/2002 | Choi | G11C 16/3409 711/154 |
| 2005/0086413 | A1* | 4/2005 | Lee | G06K 19/07732 710/313 |
| 2006/0279999 | A1* | 12/2006 | Byeon | G11C 16/16 365/185.29 |
| 2010/0002513 | A1 | 1/2010 | Lutze et al. | |
| 2010/0002514 | A1 | 1/2010 | Lutze et al. | |
| 2010/0118613 | A1* | 5/2010 | Chun | G11C 16/344 365/185.33 |
| 2013/0279265 | A1* | 10/2013 | Lee | G11C 16/16 365/185.24 |
| 2014/0098615 | A1* | 4/2014 | Mu | G11C 16/344 365/185.22 |
| 2014/0204678 | A1* | 7/2014 | Mu | G11C 16/349 365/185.19 |

* cited by examiner

1100

ERASE SATURATION MITIGATION IN NON-VOLATILE MEMORY

CLAIM OF PRIORITY

The present application claims priority from U.S. Provisional Patent Application No. 63/500,728, entitled "ERASE SATURATION MITIGATION IN NON-VOLATILE MEMORY," by Song et al., filed May 8, 2023, incorporated by reference herein in its entirety.

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. Herein, a memory system that uses non-volatile memory for storage may be referred to as a storage system. The memory structure may be three-dimensional (3D). One type of 3D structure has non-volatile memory cells arranged as vertical NAND strings. The 3D memory structure may be arranged into units that are commonly referred to as physical blocks. For example, a physical block in a NAND memory system contains many NAND strings. A NAND string contains memory cell transistors connected in series, a drain side select gate at one end, and a source side select gate at the other end. Each NAND string is associated with a bit line. The physical block typically has many word lines that provide voltages to the control gates of the memory cell transistors. In some architectures, each word line connects to the control gate of one memory cell on each respective NAND string in the physical block.

The memory cells are programmed one group at a time. The unit of programming is typically referred to as a page. Typically, the memory cells are programmed to a number of data states. Using a greater number of data states allows for more bits to be stored per memory cell. For example, four data states may be used to store two bits per memory cell, eight data states may be used in order to store three bits per memory cell, 16 data states may be used to store four bits per memory cell, etc. Some memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell.

One type of three-dimensional memory structure has alternating dielectric layers and conductive layers in a stack. NAND strings are formed vertically in the alternating dielectric layers and conductive layers in what may be referred to as memory holes. For example, after memory holes are drilled into the stack of alternating dielectric layers and conductive layers, the memory holes are filled in with layers of materials including a charge-trapping material to create a vertical column of memory cells (e.g., NAND string). The semiconductor fabrication process for forming a three-dimensional memory structure may result in location dependent physical differences between similar structures.

There may be significant physical variations between different regions of the memory structure due to, for example, variations in the manufacturing process. For example there could be variations in the thickness of conductive layers, dielectric layers, memory hole material layers, etc. Such physical variations could be from die to die, from block to block, from NAND string to NAND string, etc. Such physical variations can impact memory operations including, but not limited to erase.

For memory such as NAND, a large set of memory cells are erased prior to programming. In some cases, the memory cells of an entire physical block are erased as a group. In some cases, the memory cells of a portion of a physical block are erased as a group. Erasing typically includes a number of erase loops, with each loop including applying an erase pulse and then verifying whether erase is complete. Typically, there is a limit to how many erase loops are permitted before the erase is considered to have failed. Also, if different NAND strings erase at different speeds then it is possible that the NAND strings that are faster to erase will be "over-erased" in order to erase the slower to erase NAND strings. Over-erase of NAND strings can damage the memory cells.

BRIEF DESCRIPTION OF THE DRAWINGS

Like-numbered elements refer to common components in the different figures.

DETAILED DESCRIPTION

Technology is disclosed herein for a storage system that mitigates erase saturation when erasing memory cells. In an embodiment, the storage system compensates for physical differences between different memory cells undergoing erase. For example, some NAND strings may erase more slowly than others. Therefore, it is possible that some NAND strings may pass erase while others need more erase loops to pass. In some cases, erase of the slower NAND strings is so slow that it will take multiple additional loops to pass erase. These extra erase loops could damage memory cells on the faster to erase NAND strings. The storage system prevents damage to memory cells on the faster to erase NAND strings while allowing enough erase loops to complete erase of the slower to erase NAND strings. The term "erase saturation" may be used to refer to a slow to erase NAND string that does not respond much to the erase pulse.

In one embodiment, the storage system will perform a number of erase loops in which each loop an erase pulse is applied to memory cells on a group of NAND strings and an erase verify is performed. If erase does not pass after a number of erase loops the storage system applies a program pulse to memory cells on the faster to erase NAND strings, such as the NAND strings that passed erase. However, memory cells on the slower to erase NAND strings are inhibited from programming. The program pulse increases the Vt of memory cells on the faster to erase NAND strings. Then, another erase loop is performed. At this point the erase process could end. However, the process could continue with additional loops, with each loop programming the memory cells on the faster to erase NAND strings followed by an erase pulse to all NAND strings and erase verify. Over-erase of the memory cells on the faster to erase NAND strings is therefore prevented. Moreover, slower to erase NAND strings that may otherwise be a bottleneck do not prevent successful completion of the erase.

Figure 1:
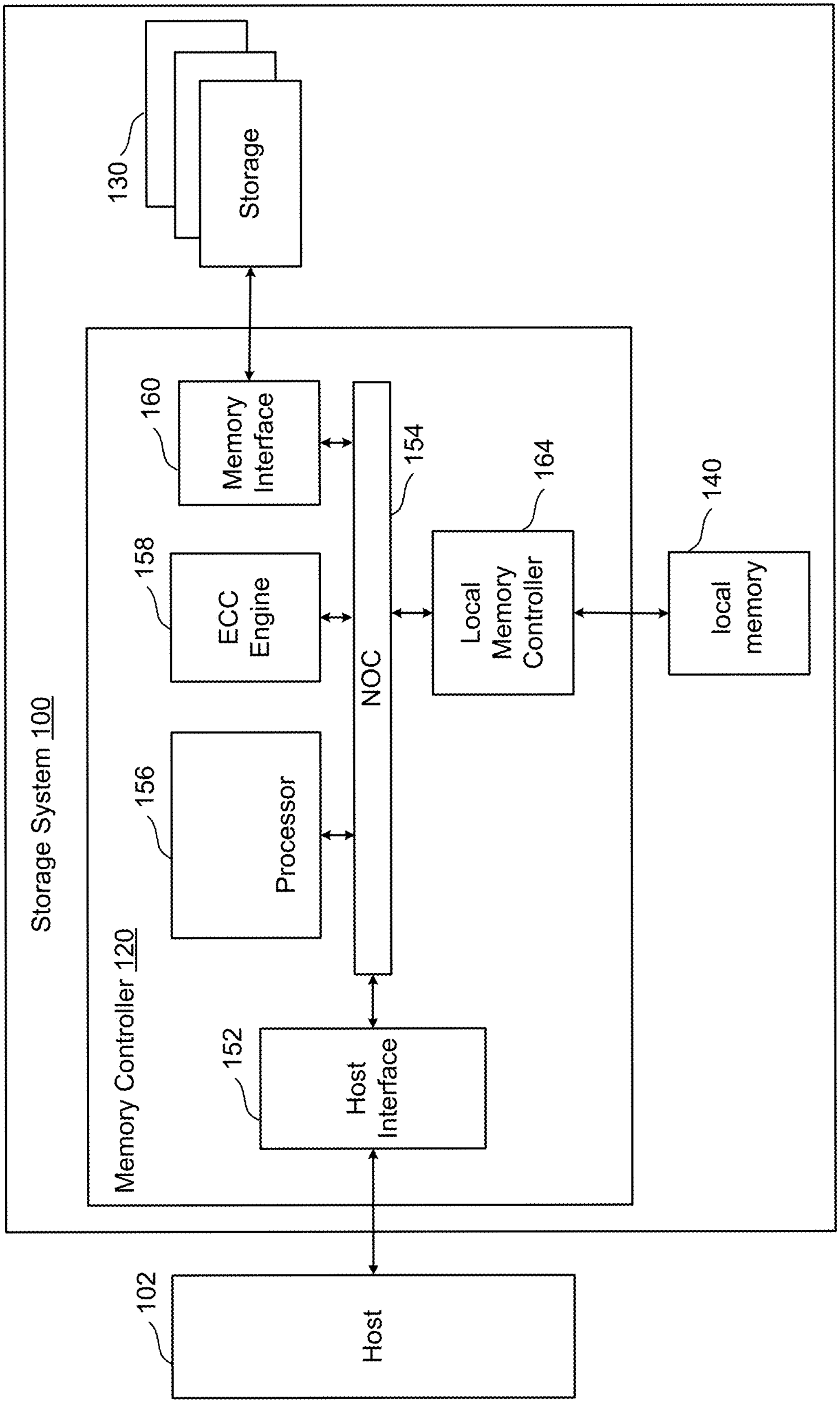
FIG. 1 is a block diagram depicting one embodiment of a storage system.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
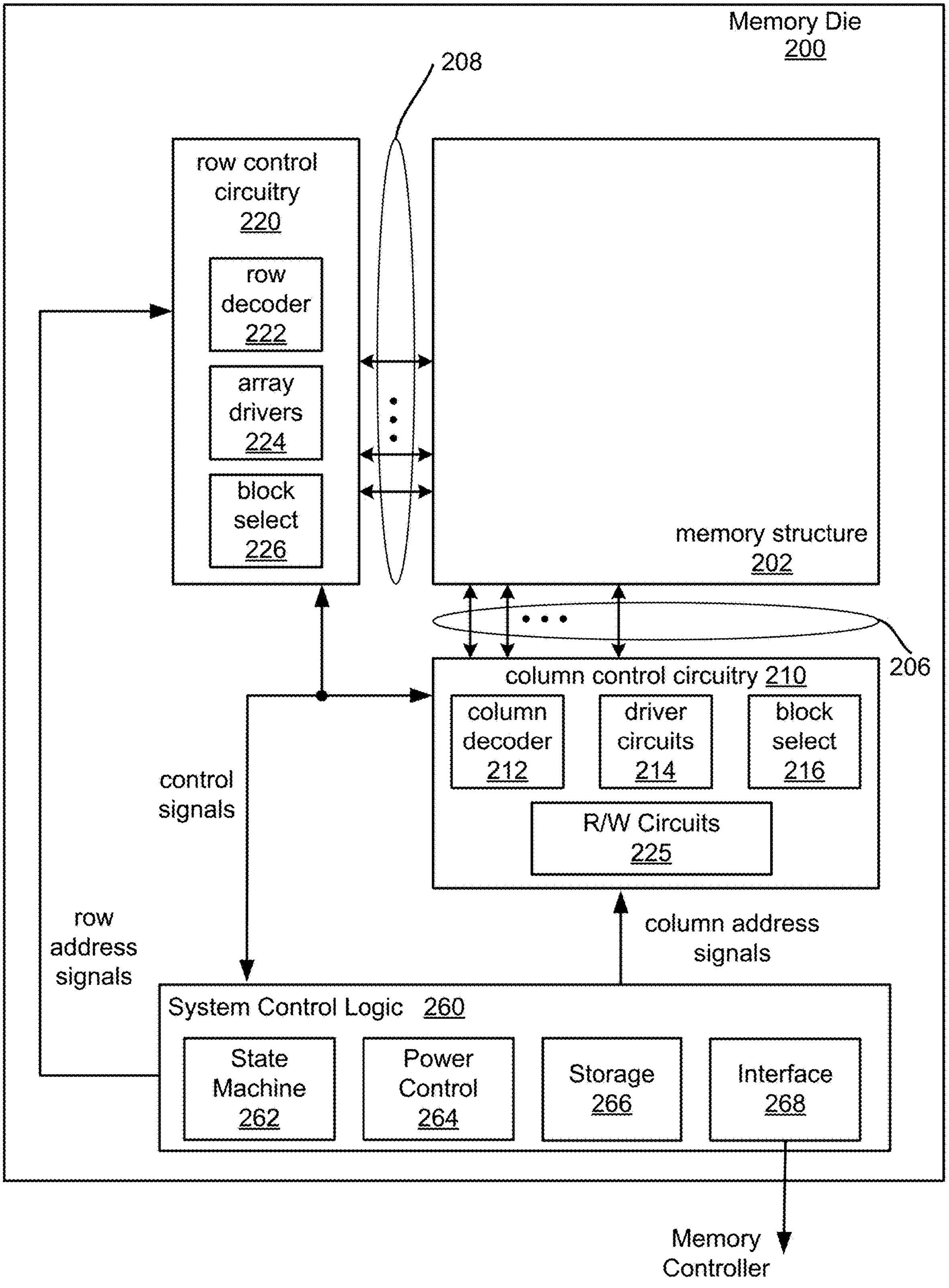
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers. The system control logic 260, column control circuitry 210, and/or row control circuitry 220 are configured to control memory operations such as open block reads at the die level.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used. The commands may include one or more commands to execute an open block read in accordance with one or more embodiments described herein.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 2B:
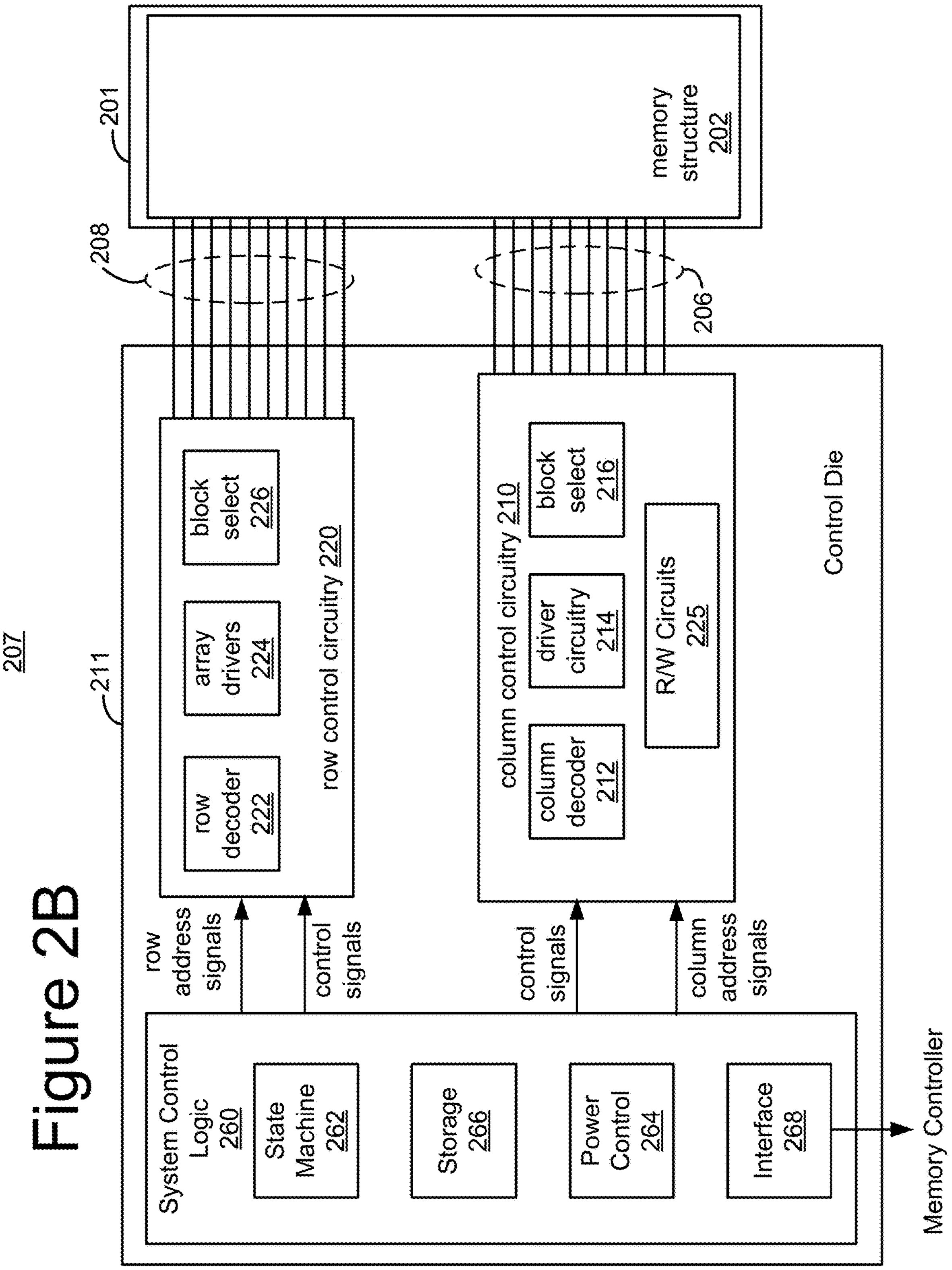
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, storage 130, memory die 200, integrated memory assembly 207, and/or control die 211.

Figure 3A:
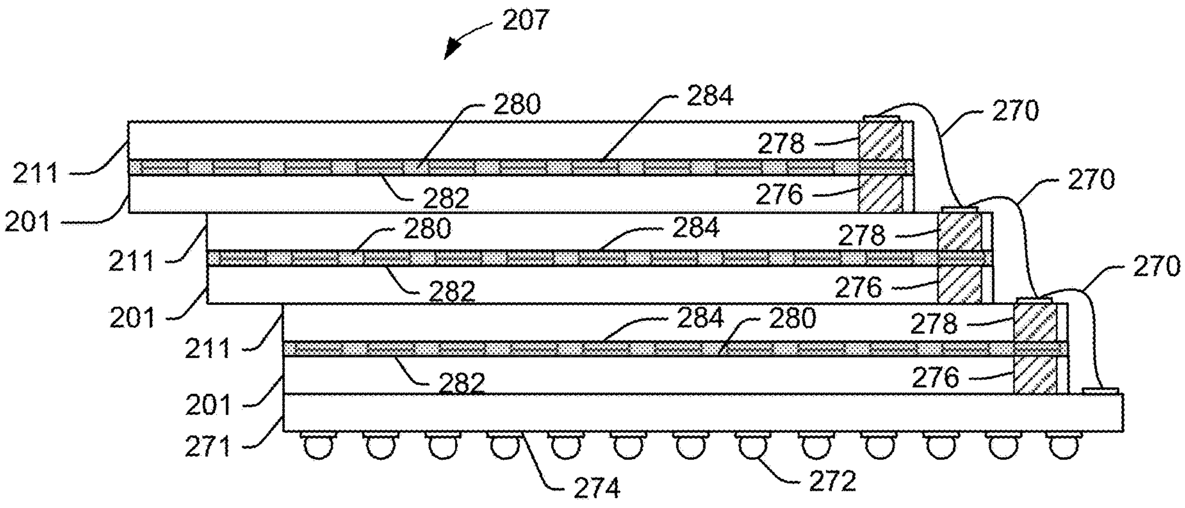
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
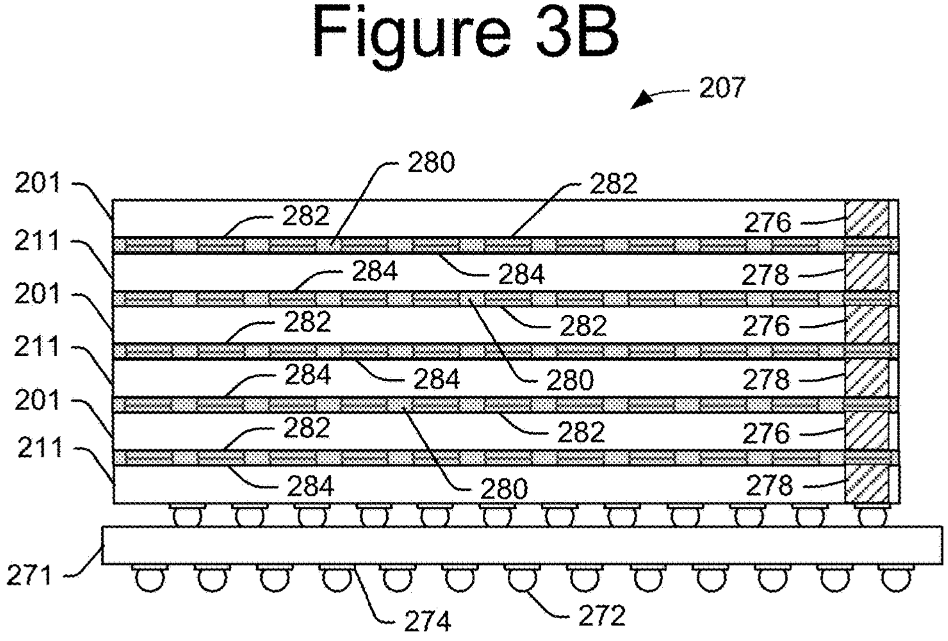

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

Figure 3C:
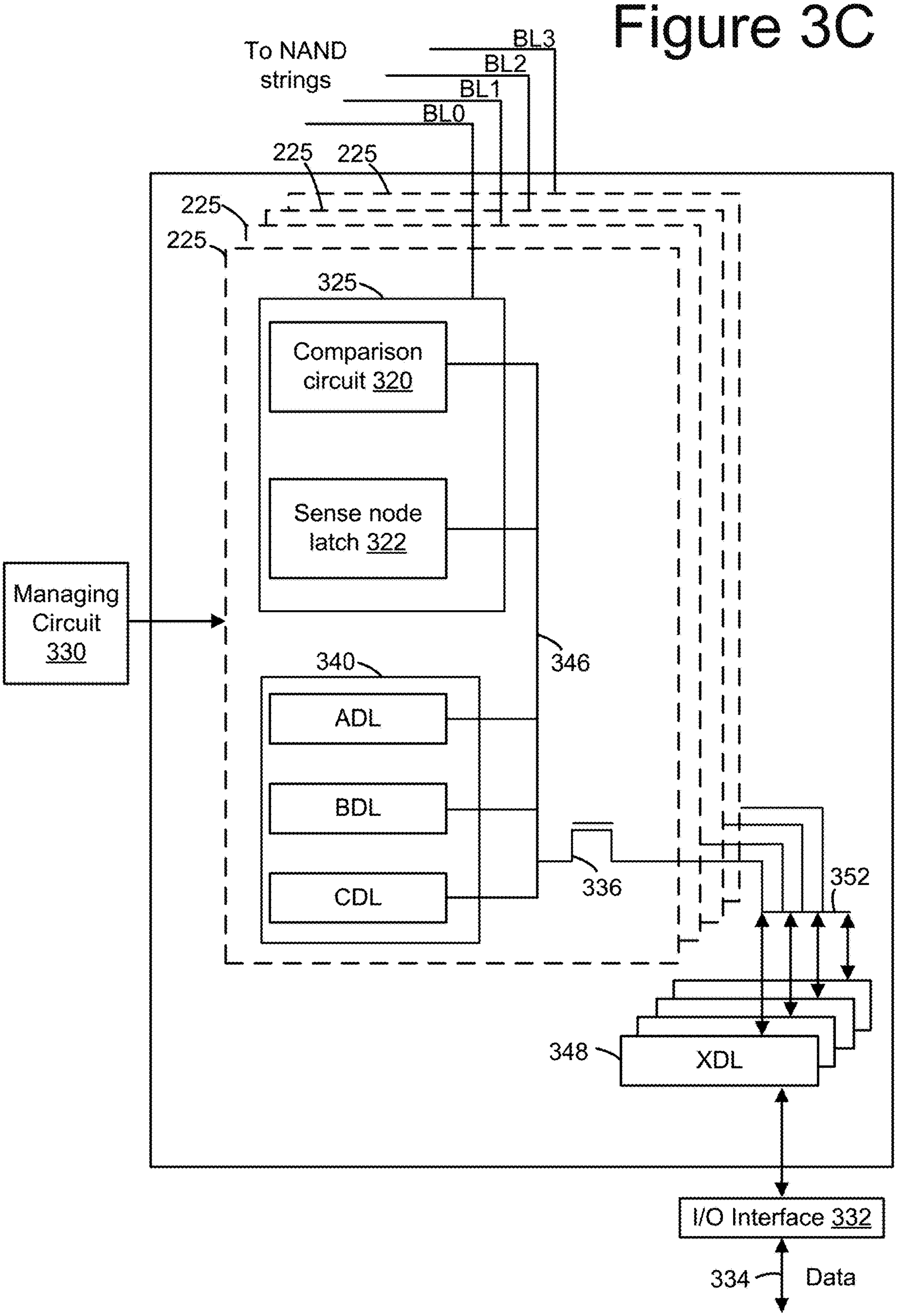
FIG. 3C is a block diagram depicting one embodiment of a portion of column control circuitry that contains a number of read/write circuits.

FIG. 3C is a block diagram depicting one embodiment of a portion of column control circuitry 210 that contains a number of read/write circuits 225. Each read/write circuit 225 is partitioned into a sense amplifier 325 and data latches 340. A managing circuit 330 controls the read/write circuits 225. The managing circuit 330 may communicate with state machine 262. In one embodiment, each sense amplifier 325 is connected to a respective bit line. Each bit line may be connected, at one point in time, to one of a large number of different NAND strings. A select gate on the NAND string may be used to connect the NAND string channel to the bit line.

Each sense amplifier 325 operates to provide voltages to one of the bit lines (see BL0, BL1, BL2, BL3) during program, verify, erase, and read operations. Sense amplifiers are also used to sense the condition (e.g., data state) of a memory cell in a NAND string connected to the bit line that connects to the respective sense amplifier.

Each sense amplifier 325 may have a sense node. During sensing, a sense node is charged up to an initial voltage, Vsense_init, such as 3V. The sense node is then connected to the bit line for a sensing time, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state. In an embodiment, the sense node has a capacitor that is pre-charged and then discharged for the sensing time.

In particular, the comparison circuit 320 determines the amount of decay by comparing the sense node voltage to a trip voltage after the sensing time. If the sense node voltage decays below the trip voltage. Vtrip, the memory cell is in a conductive state and its Vth is at or below the verify voltage. If the sense node voltage does not decay below Vtrip, the memory cell is in a non-conductive state and its Vth is above the verify voltage. A sense node latch 322 is set to 0 or 1, for example, by the comparison circuit 320 based on whether the memory cell is in a conductive or non-conductive state, respectively. The bit in the sense node latch 322 can also be used in a lockout scan to decide whether to set a bit line voltage to an inhibit or a program enable level in a next program loop. The bit in the sense node latch 322 can also be used in a lockout mode to decide whether to set a bit line voltage to a sense voltage or a lockout voltage in a read operation.

The data latches 340 are coupled to the sense amplifier 325 by a local data bus 346. The data latches 340 include three latches (ADL, BDL, CDL) for each sense amplifier 325 in this example. More or fewer than three latches may be included in the data latches 340. In one embodiment, for programming each data latch 340 is used to store one bit to be stored into a memory cell and for reading each data latch 340 is used to store one bit read from a memory cell. In a three bit per memory cell embodiment, ADL stores a bit for a lower page of data, BDL stores a bit for a middle page of data, CDL stores a bit for an upper page of data. Each read/write circuit 225 is connected to an XDL latch 348 by way of an XDL bus 352. In this example, transistor 336 connects local data bus 346 to XDL bus 352. An I/O interface 332 is connected to the XDL latches 348. The XDL latch 348 associated with a particular read/write circuit 225 serves as an interface latch for storing/latching data from the memory controller.

Managing circuit 330 performs computations, such as to determine the data stored in the sensed memory cell and store the determined data in the set of data latches. Each set of data latches 340 is used to store data bits determined by managing circuit 330 during a read operation, and to store data bits imported from the data bus 334 during a program operation which represent write data meant to be programmed into the memory. I/O interface 332 provides an interface between XDL latches 348 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to managing circuit 330. At that point, managing circuit 330 determines the resultant memory state by consideration of the tripping event(s) of the sense circuit and the information about the applied control gate voltage from the state machine. It then computes a binary encoding for the memory state and stores the resultant data bits into data latches 340.

During program or verify operations for memory cells, the data to be programmed (write data) is stored in the set of data latches 340 from the data bus 334 by way of XDL latches 348. The program operation, under the control of the state machine 262, applies a series of programming voltage pulses to the control gates of the addressed memory cells. Each voltage pulse may be stepped up in magnitude from a previous program pulse by a step size in a process referred to as incremental step pulse programming. In one embodiment, each program voltage is followed by a verify operation to determine if the memory cells have been programmed to the desired memory state. In some cases, managing circuit 330 monitors the read back memory state relative to the desired memory state. When the two agree, managing circuit 330 sets the bit line in a program inhibit mode such as by updating its latches. This inhibits the memory cell coupled to the bit line from further programming even if additional program pulses are applied to its control gate.

Figure 4:
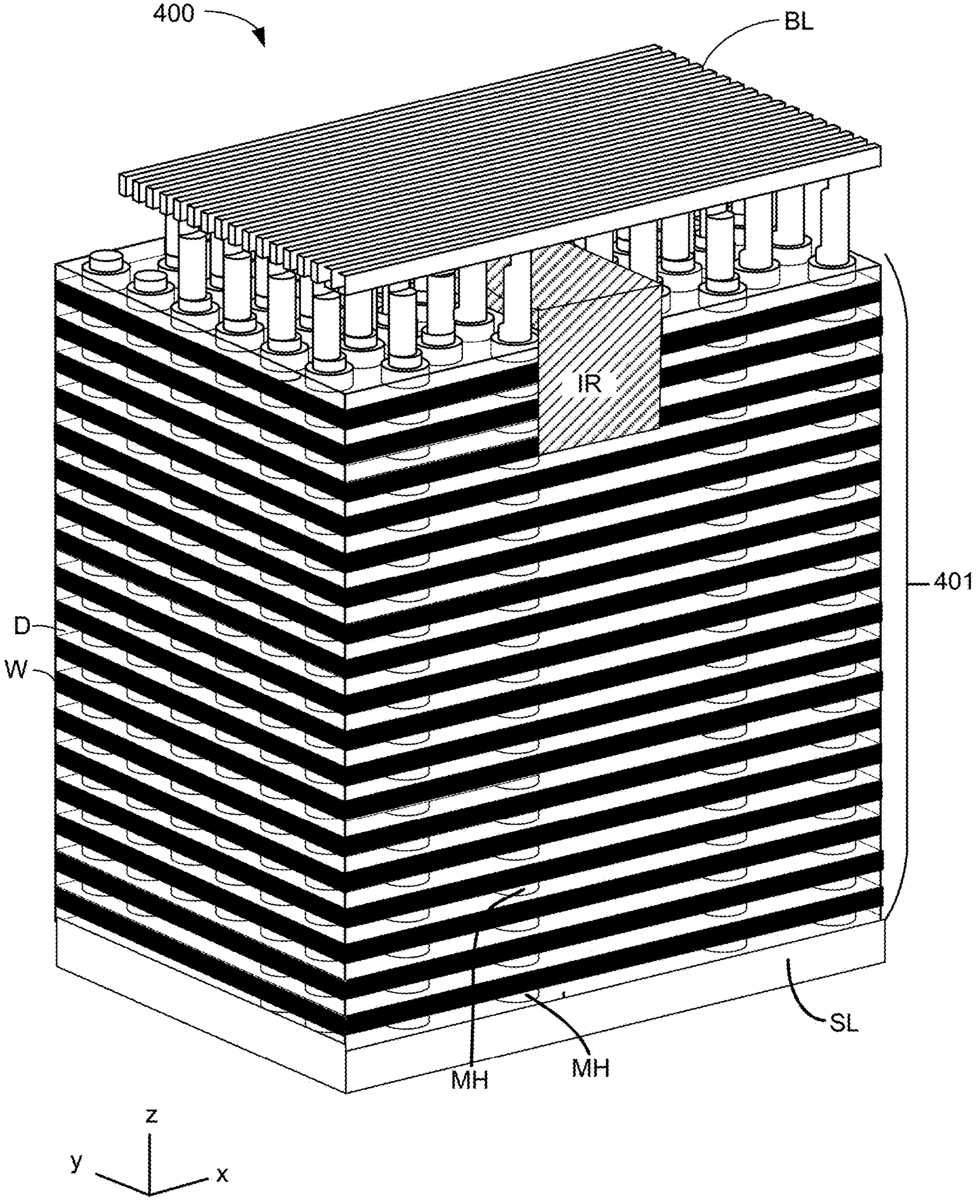
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
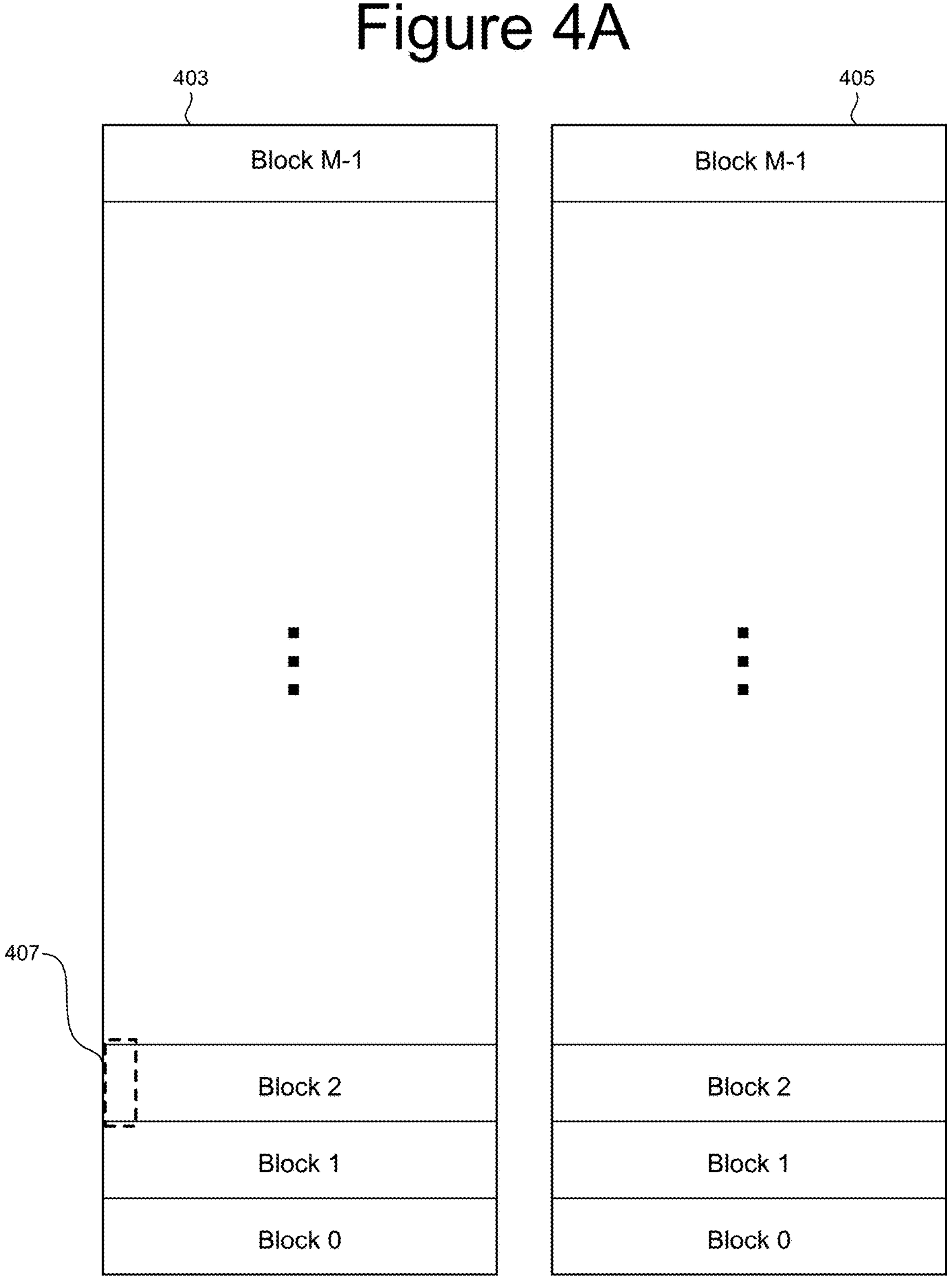
FIG. 4A is a block diagram of one embodiment of a memory structure having two planes.

FIG. 4A is a block diagram explaining one example organization of memory structure 202, which is divided into two planes 403 and 405. Each plane is then divided into M physical blocks. In one example, each plane has about 2000 physical blocks (or more briefly "blocks"). However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 403/405, more or fewer than two planes can be implemented. In some embodiments, memory structure 202 includes four planes. In some embodiments, memory structure 202 includes eight planes. In some embodiments, programming can be performed in parallel in a first selected block in plane 403 and a second selected block in plane 405.

Figure 4B:
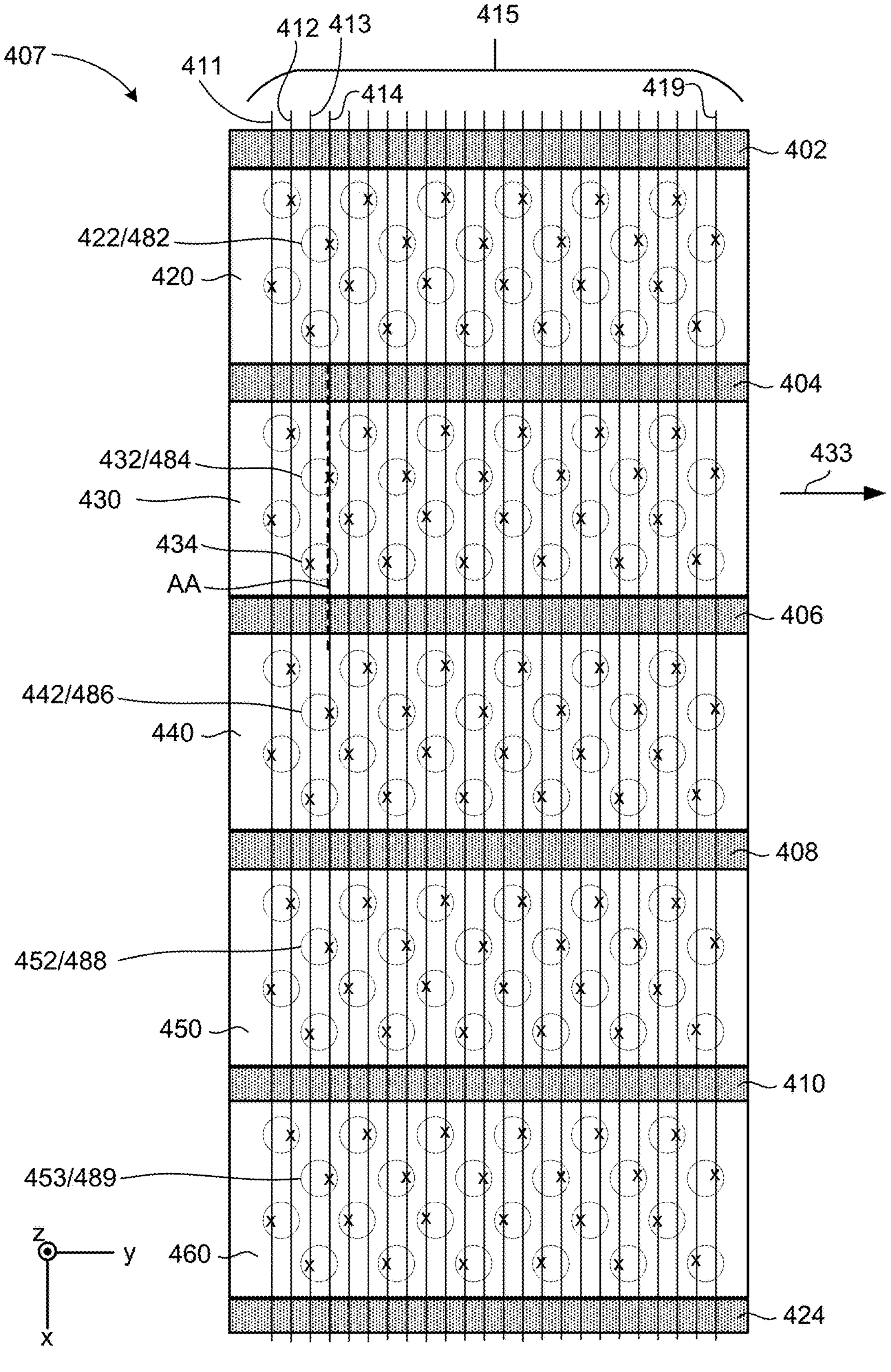
FIG. 4B is a block diagram depicting a top view of a portion of block of memory cells.

FIGS. 4B-4E depict an example three dimensional ("3D") NAND structure that corresponds to the structure of FIG. 4 and can be used to implement memory structure 202 of FIGS. 2A and 2B. FIG. 4B is a diagram depicting a top view of a portion 407 of Block 2. As can be seen from FIG. 4B, the physical block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, 452 and 453. Vertical column 422 implements NAND string 482. Vertical column 432 implements NAND string 484. Vertical column 442 implements NAND string 486. Vertical column 452 implements NAND string 488. Vertical column 453 implements NAND string 486. Vertical column 452 implements NAND string 489. More details of the vertical columns are provided below. Since the physical block depicted in FIG. 4B extends in the direction of arrow 433, the physical block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the physical block is depicted. It is contemplated that more than twenty-four bit lines connected to vertical columns of the physical block. Each of the circles representing vertical columns has an "x" to indicate its connection to one bit line. For example, bit line 414 is connected to vertical columns 422, 432, 442 and 452.

The physical block depicted in FIG. 4B includes a set of isolation regions 402, 404, 406, 408, 410, and 424, which are formed of $SiO_2$; however, other dielectric materials can also be used. Isolation regions 402, 404, 406, 408, 410, and 424 serve to divide the top layers of the physical block into five regions; for example, the top layer depicted in FIG. 4B is divided into regions 420, 430, 440, 450, and 460 of which are referred to as sub-blocks. In one embodiment, isolation regions 402 and 424 separate the physical block 407 from adjacent physical blocks. Thus, isolation regions 402 and 424 may extend down to the substrate. In one embodiment, the isolation regions 404, 406, and 410 only divide the layers used to implement select gates so that NAND strings in different sub-blocks can be independently selected. Referring back to FIG. 4, the IR region may correspond to any of isolation regions 404, 406, 408, or 410. In one example implementation, a bit line only connects to one vertical column/NAND string in each of regions (sub-blocks) 420, 430, 440, 450, and 460. In that implementation, each physical block has twenty rows of active columns and each bit line connects to five rows in each block. In one embodiment, all of the five vertical columns/NAND strings connected to a common bit line are connected to the same word line (or set of word lines); therefore, the system uses the drain side selection lines to choose one (or another subset) of the five to be subjected to a memory operation (program, verify, read, and/or erase).

Although FIG. 4B shows each region (420, 430, 440, 450, 460) having four rows of vertical columns, five regions (420, 430, 440, 450, 460) and twenty rows of vertical columns in a block, those exact numbers are an example implementation. Other embodiments may include more or fewer regions (420, 430, 440, 450, 460) per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
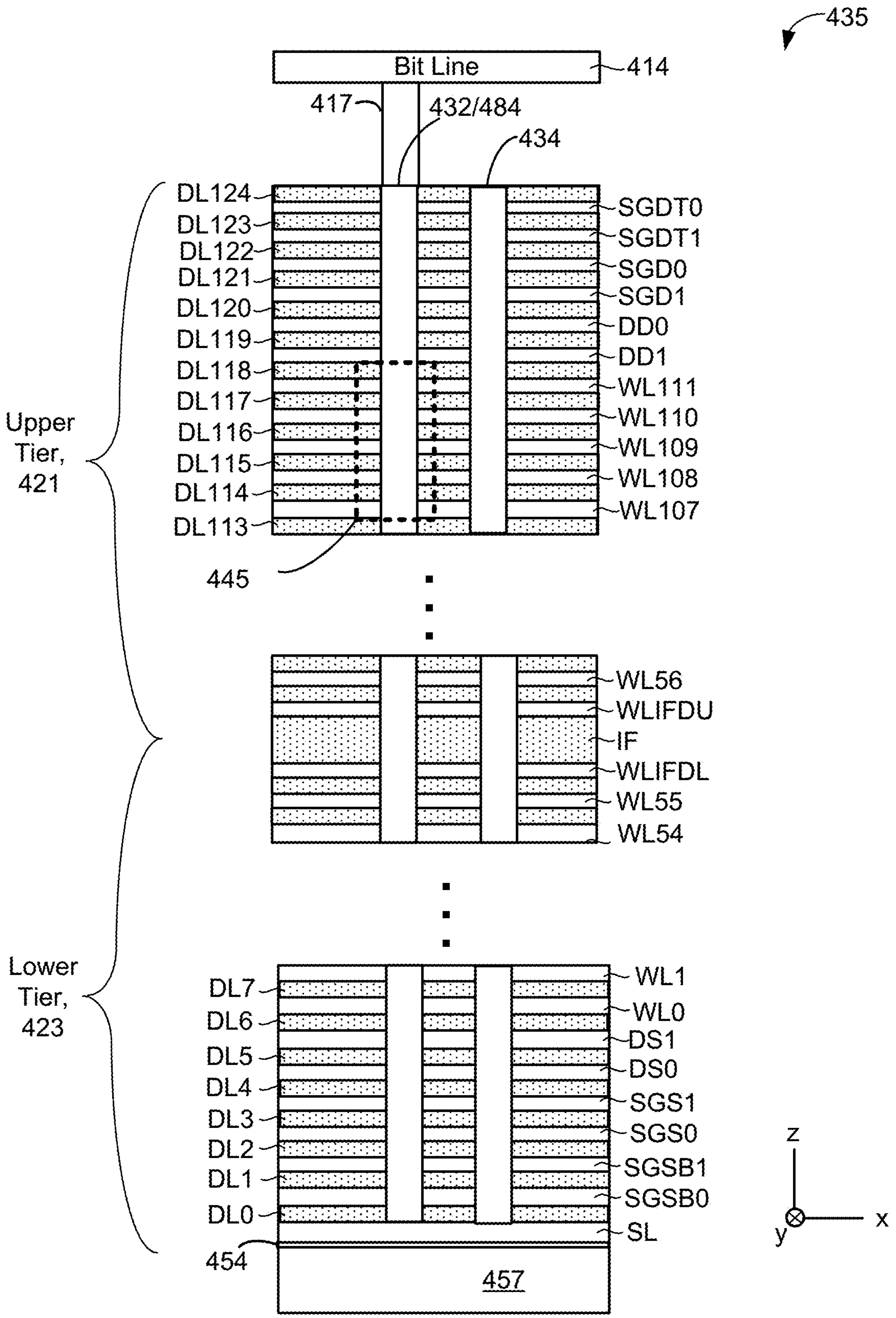
FIG. 4C depicts an embodiment of a stack showing a cross-sectional view along line AA of FIG. 4B.

FIG. 4C depicts an example of a stack 435 showing a cross-sectional view along line AA of FIG. 4B. The SGD layers include SGDT0, SGDT1, SGD0, and SGD1. The SGD layers may have more or fewer than four layers. The SGS layers includes SGSB0, SGSB1, SGS0, and SGS1. The SGS layers may have more or fewer than four layers. Six dummy word line layers DD0, DD1, WLIFDU, WLIDDL, DS1, and DS0 are provided, in addition to the data word line layers WL0-WL111. There may be more or fewer than 112 data word line layers and more or fewer than four dummy word line layers. Each NAND string has a drain side select gate at the SGD layers. Each NAND string has a source side select gate at the SGS layers. Also depicted are dielectric layers DL0-DL124.

Columns 432, 434 of memory cells are depicted in the multi-layer stack. The stack includes a substrate 457, an insulating film 454 on the substrate, and a portion of a source line SL. A portion of the bit line 414 is also depicted. Note that NAND string 484 is connected to the bit line 414. NAND string 484 has a source-end at a bottom of the stack and a drain-end at a top of the stack. The source-end is connected to the source line SL. A conductive via 417 connects the drain-end of NAND string 484 to the bit line 414.

In one embodiment, the memory cells are arranged in NAND strings. The word line layers WL0-WL111 connect to memory cells (also called data memory cells). Dummy word line layers DD0, DD1, DS0 and DS1 connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD are used to electrically connect and disconnect (or cut off) the channels of respective NAND strings from bit lines. Source side select layers SGS are used to electrically connect and disconnect (or cut off) the channels of respective NAND strings from the source line SL.

FIG. 4C depicts an example of a stack 435 having two tiers. The two-tier stack comprises an upper tier 421 and a lower tier 423. A two-tier other multi-tier stack can be used to form a relatively tall stack while maintaining a relatively narrow memory hole width (or diameter). After the layers of the lower tier are formed, memory hole portions are formed in the lower tier. Subsequently, after the layers of the upper tier are formed, memory hole portions are formed in the upper tier, aligned with the memory hole portions in the lower tier to form continuous memory holes from the bottom to the top of the stack. The resulting memory hole is narrower than would be the case if the hole were etched from the top to the bottom of the stack rather than in each tier individually. An interface (IF) region is created where the two tiers are connected. The IF region is typically thicker than the other dielectric layers. Due to the presence of the IF region, the adjacent word line layers suffer from edge effects such as difficulty in programming or erasing. These adjacent word line layers can therefore be set as dummy word lines (WLIFDL, WLIFDU). In some embodiments, the upper tier 421 and the lower tier 423 are erased independent of one another. Hence, data may be maintained in the lower tier 423 after the upper tier 421 is erased. Likewise, data may be maintained in the upper tier 421 after the lower tier 423 is erased.

Figure 4D:
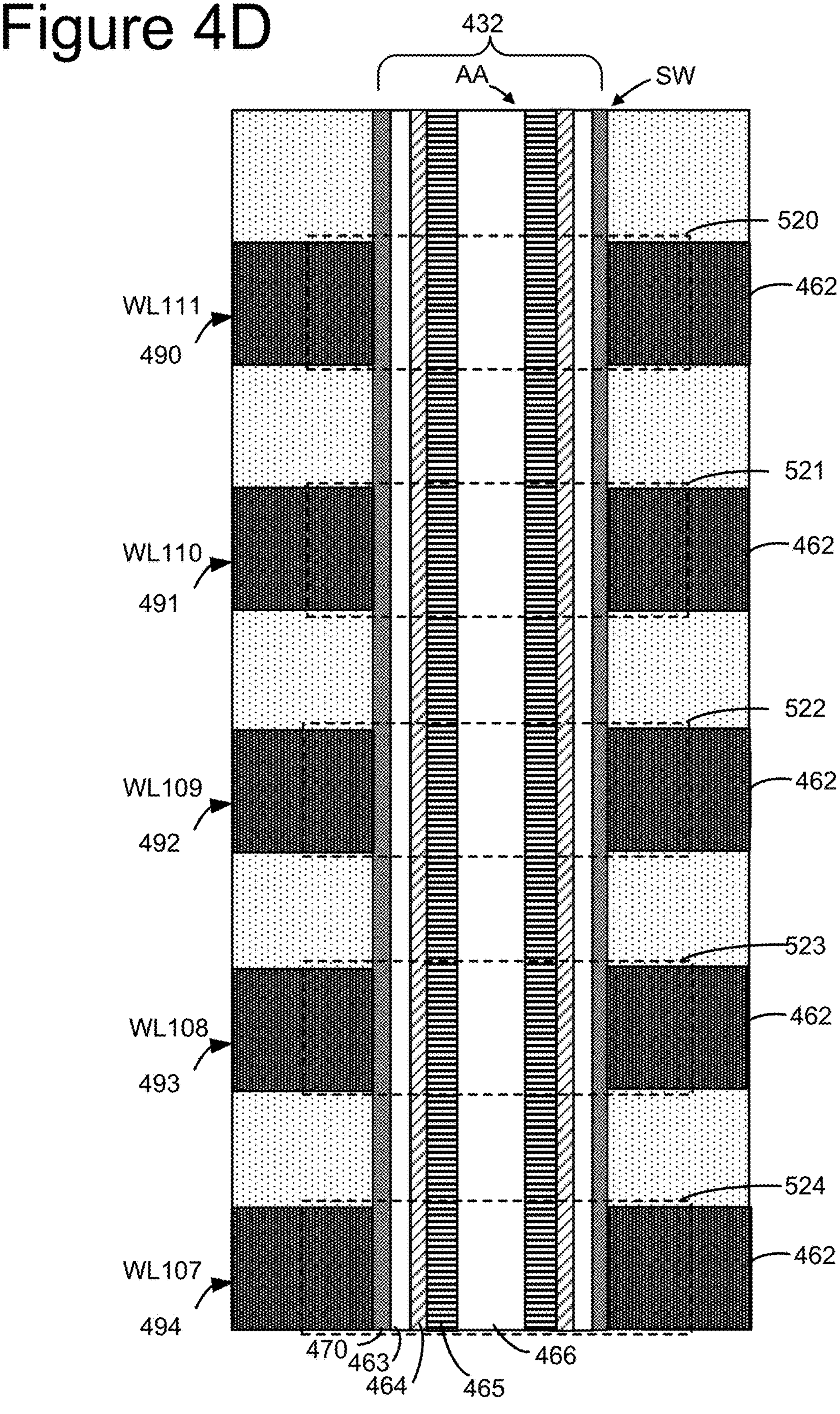
FIG. 4D depicts a view of the region 445 of FIG. 4C.

FIG. 4D depicts a view of the region 445 of FIG. 4C. Data memory cell transistors 520, 521, 522, 523, and 524 are indicated by the dashed lines. A number of layers can be deposited along the sidewall (SW) of the memory hole 432 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
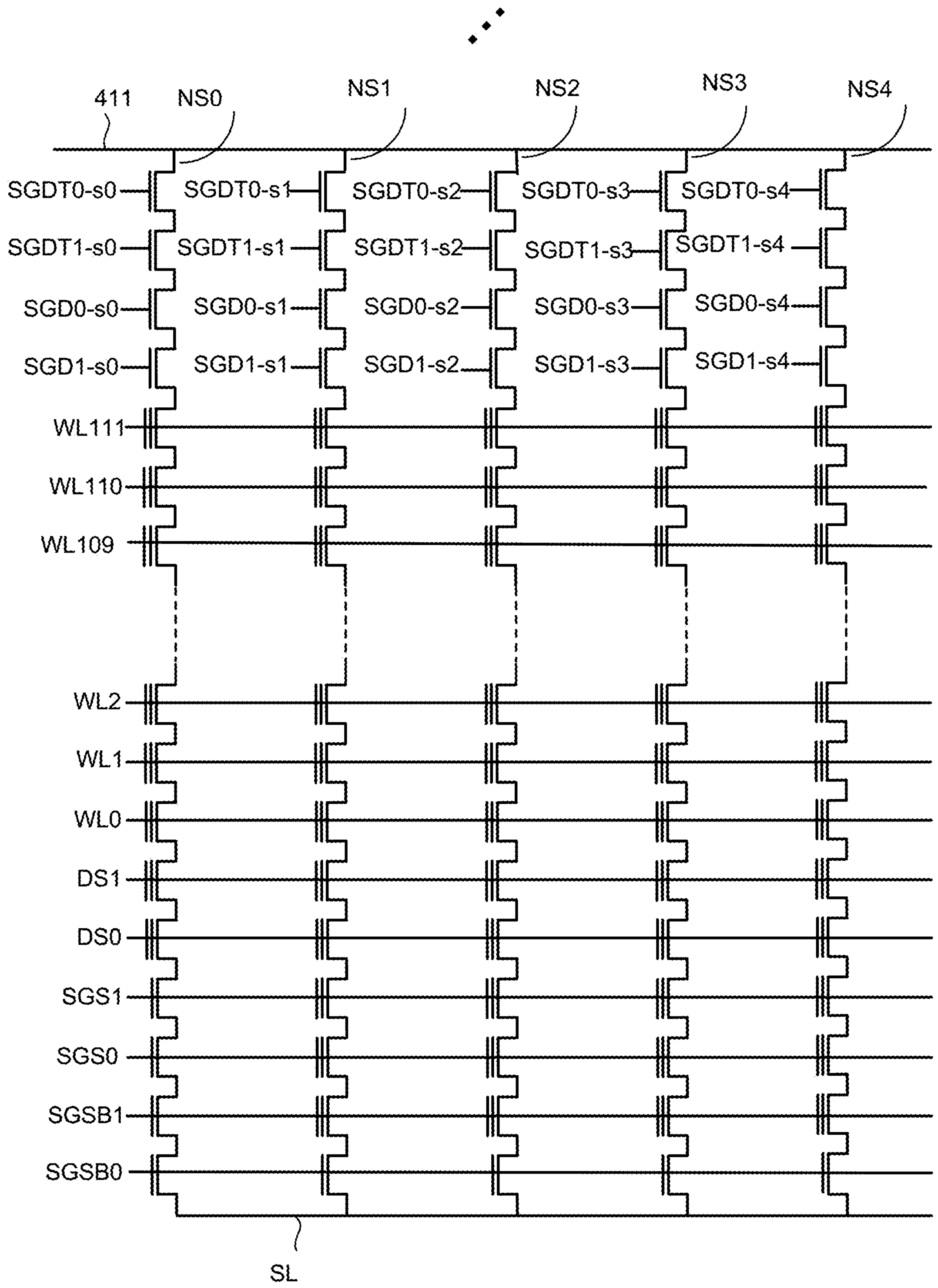
FIG. 4E is a schematic diagram of a portion of one embodiment of a block, depicting several NAND strings.

FIG. 4E is a schematic diagram of a portion of the memory array 202. FIG. 4E shows physical data word lines WL0-WL111 running across the entire block. The structure of FIG. 4E corresponds to a portion 407 in Block 2 of FIG. 4A, including bit line 411. Within the physical block, in one embodiment, each bit line is connected to five NAND strings. Thus, FIG. 4E shows bit line 411 connected to NAND string NS0, NAND string NS1, NAND string NS2, NAND string NS3, and NAND string NS4.

In one embodiment, there are five sets of drain side select lines in the physical block. For example, the set of drain side select lines connected to NS0 include SGDT0-*s*0, SGDT1-*s*0. SGD0-*s*0, and SGD1-*s*0. The set of drain side select lines connected to NS1 include SGDT0-*s*1, SGDT1-*s*1, SGD0-*s*1, and SGD1-*s*1. The set of drain side select lines connected to NS2 include SGDT0-*s*2, SGDT1-*s*2, SGD0-*s*2, and SGD1-*s*2. The set of drain side select lines connected to NS3 include SGDT0-*s*3, SGDT1-*s*3, SGD0-*s*3, and SGD1-*s*3. The set of drain side select lines connected to NS4 include SGDT0-*s*4, SGDT1-*s*4, SGD0-*s*4, and SGD1-*s*4. Herein the term "SGD" may be used as a general term to refer to any one or more of the lines in a set of drain side select lines. In an embodiment, each line in a given set may be operated independent from the other lines in that set to allow for different voltages to the gates of the four drain side select transistors on the NAND string. Moreover, each set of drain side select lines can be selected independent of the other sets. Each set drain side select lines connects to a group of NAND strings in the block. Only one NAND string of each group is depicted in FIG. 4E. These five sets of drain side select lines correspond to five sub-blocks. A first sub-block corresponds to those vertical NAND strings controlled by SGDT0-*s*0, SGDT1-*s*0, SGD0-*s*0, and SGD1-*s*0. A second sub-block corresponds to those vertical NAND strings controlled by SGDT0-*s*1, SGDT1-*s*1, SGD0-*s*1, and SGD1-*s*1. A third sub-block corresponds to those vertical NAND strings controlled by SGDT0-*s*2, SGDT1-*s*2, SGD0-*s*2, and SGD1-*s*2. A fourth sub-block corresponds to those vertical NAND strings controlled by SGDT0-*s*3. SGDT1-*s*3, SGD0-*s*3, and SGD1-*s*3. A fifth sub-block corresponds to those vertical NAND strings controlled by SGDT0-*s*4, SGDT1-*s*4, SGD0-*s*4, and SGD1-*s*4. As noted, FIG. 4E only shows the NAND strings connected to bit line 411. However, a full schematic of the block would show every bit line and five vertical NAND strings connected to each bit line.

In one embodiment, all of the memory cells on the NAND strings in a physical block are erased as a unit. However in some embodiments, a physical block is operated as an upper tier and a lower tier, wherein the upper tier and the lower tier each form an erase unit. For example, memory cells connected to WL0-WL55 may be in the lower tier 423 and memory cells connected to WL56-WL111 may be in the upper tier 421. Hence, memory cells connected to WL0-WL55 may be in one erase unit and memory cells connected to WL56-WL111 may be in another erase unit. A physical block could be operated in more than two tiers. Erase units can be formed based on other divisions of physical blocks.

Although the example memories of FIGS. 4-4E are three dimensional memory structure that includes vertical NAND strings with charge-trapping material, other 3D memory structures can also be used with the technology described herein.

Figure 5A:
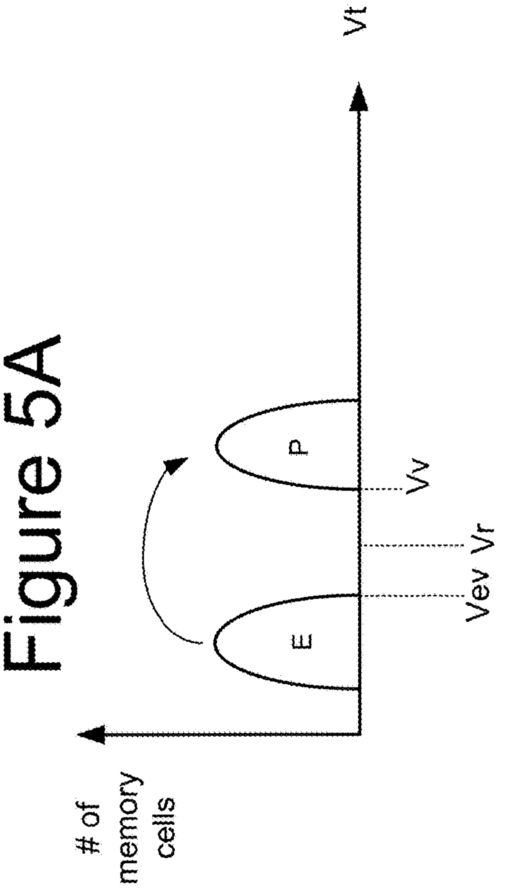
FIGS. 5A and 5B depicts threshold voltage distributions.

The storage systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores three bits of data. Other embodiments may use other data capacities per memory cell (e.g., such as two, four, or five bits of data per memory cell).

Figure 5B:
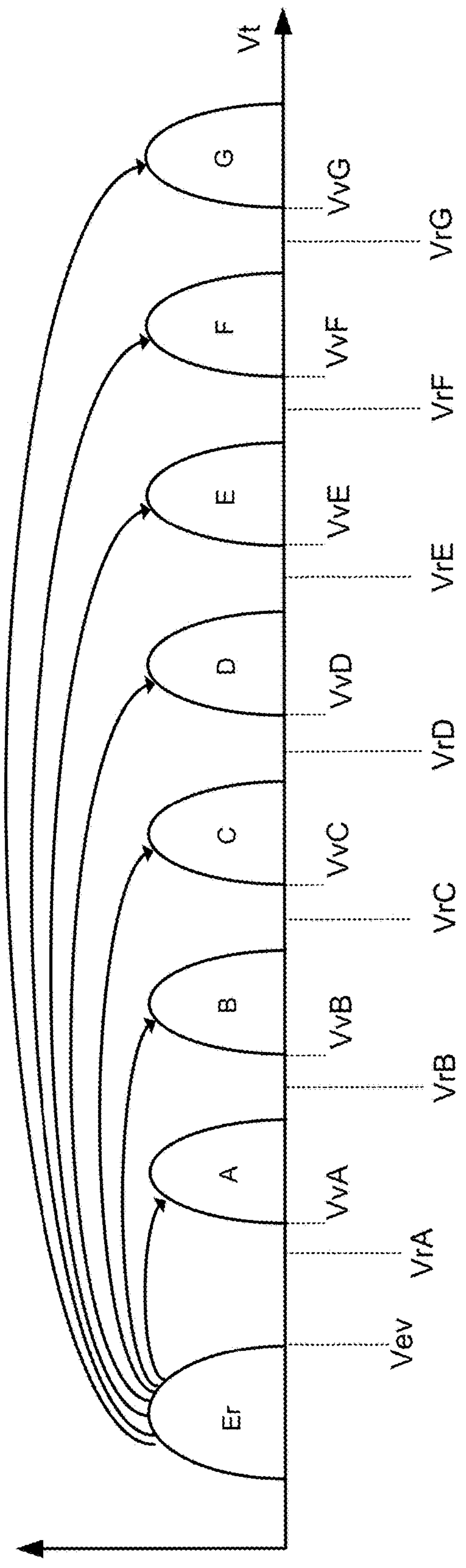

FIG. 5B shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. In an embodiment, the number of memory cells in each state is about the same.

FIG. 5B shows seven read reference voltages, VrA, VrB, VIC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in. FIG. 5B also shows a number of verify reference voltages. The verify reference voltages are VvA, VvB, VvC, VVD, VVE, VvF, and VvG. In some embodiments, when programming memory cells to data state A, the system will test whether those memory cells have a threshold voltage greater than or equal to VvA. If the memory cell has a threshold voltage greater than or equal to VvA, then the memory cell is locked out from further programming. Similar reasoning applies to the other data states.

Figure 6:
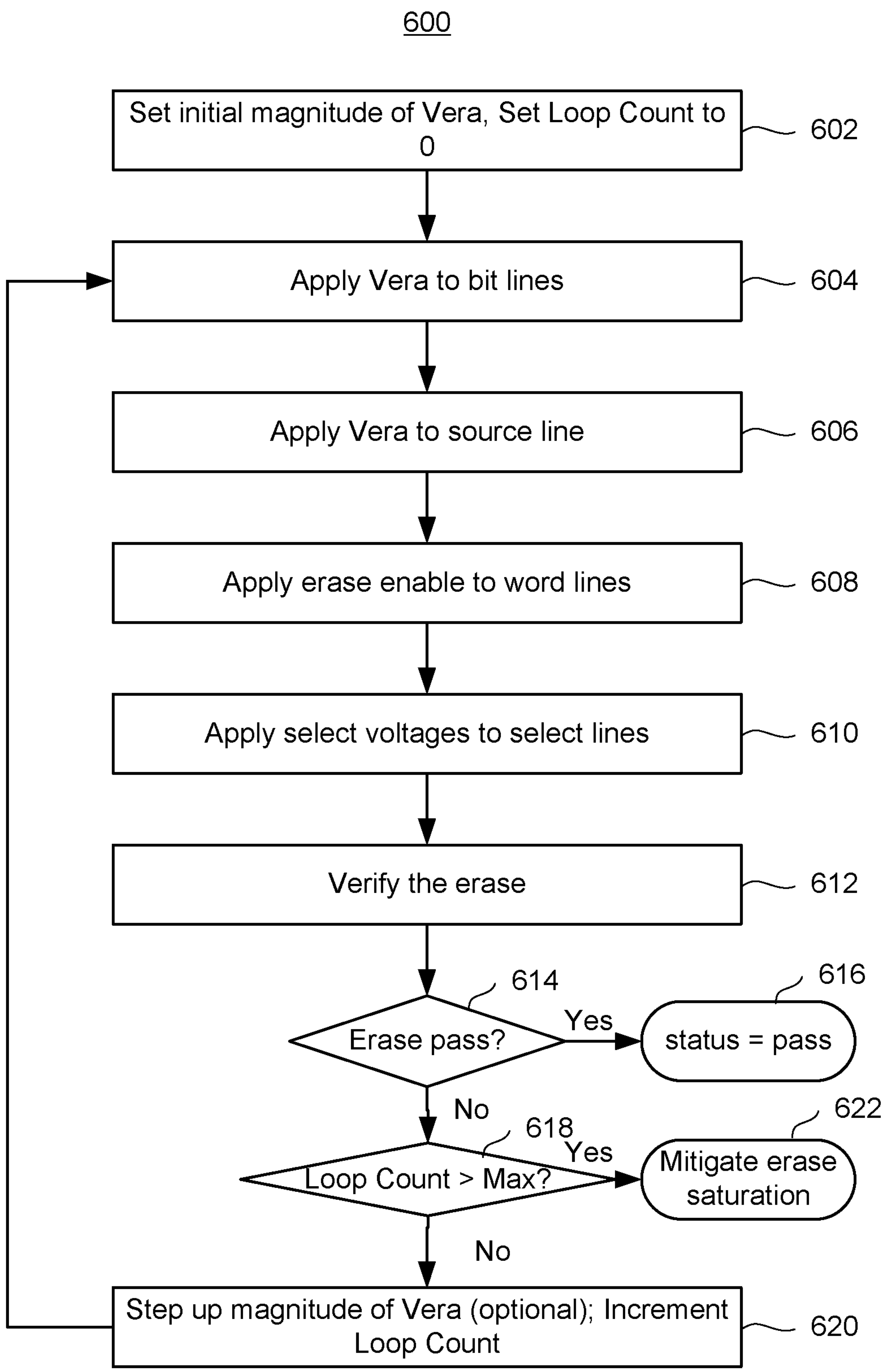
FIG. 6 is a flowchart describing one embodiment of a process for erasing memory cells.

FIG. 6 is a flowchart describing one embodiment of a process 600 for erasing memory cells. The process 600 may be used to erase an erase group of NAND memory cells. An erase group refers to a group of memory cells that are erased as a group. In one embodiment, the process 600 may be used to erase an entire physical block of NAND memory cells. In one embodiment, the process 600 may be used to erase a sub-block of the physical block of NAND memory cells. One type of sub-block are the sub-blocks selected by different select lines such as in FIG. 4E. For example, the sub-block selected by SGD-s0 may be erased independent of the other four sub-blocks. Thus, in the example in FIG. 4E, there may be five sub-blocks selected by the respective SGDs. Another type of sub-block may be referred to as tiers, as depicted in FIG. 4C. In the example in FIG. 4C, upper tier 421 is in one erase group and lower tier 423 is in another erase group. The sub-block concepts in FIGS. 4C and 4E can be combined to form erase groups. In an embodiment, system control logic 260 performs process 600 in response to a command from the memory controller 120. Process 600 describes a double sided erase in which an erase voltage (Vera) is applied at both ends of NAND strings (e.g., bit lines and source line). A variant is to perform a single sided erase in which the erase voltage is applied to only one end of the NAND strings. Process 600 describes a double-sided erase in which Vera is applied to both ends of the NAND strings (bit lines and source line(s)). One embodiment is a single-side erase in which Vera is applied to the bit lines but not to the source line(s). One embodiment is a single-side erase in which Vera is applied to the source line(s) but not to the bit lines.

Step 602 includes setting an initial magnitude of an erase voltage (Vera). The initial Vera may have a relatively large magnitude such as, for example, 20V. Step 602 also includes setting a loop counter to 0. The loop counter will be used to track an allowed number of erase loops prior to ending process 600 in the event erase has not passed. Step 604 includes applying Vera to bit lines associated with the erase group. Step 606 includes applying Vera to one or more source lines associated with the erase group. Step 608 includes applying an erase enable voltage to the word lines in the erase block. In one embodiment, the erase enable voltage is 0V but could be other than 0V such as about 0.5V. Step 610 includes applying a select voltage (turn-on voltage) to select lines (e.g., SGD, SGS). The select voltage allows Vera to pass to the NAND channels.

Thus, the erase of a memory cell includes applying an erase enable voltage (e.g., 0V) to the control gate of the memory cell while applying an erase voltage (e.g., about 20V) to a channel or body of the memory cell. An erase voltage is defined herein as a voltage applied to a channel or body of a memory cell that will erase the memory cell providing that the erase enable voltage is also applied to a control gate of that memory cell. A memory cell that has the erase voltage applied to its channel (body) may be inhibited from erase by applying an erase inhibit voltage (e.g., the erase voltage or about 20V, but the erase inhibit voltage could have a lower magnitude) to its control gate. An erase inhibit voltage is defined herein as a voltage that will inhibit erase of a memory cell despite the erase voltage being applied to a channel of that memory cell.

One technique to erase memory cells is to bias a p-well substrate to a high voltage to charge up a NAND channel. An erase enable voltage is applied to control gates of memory cells while the NAND channel is at a high voltage to erase the memory cells. In one embodiment, a p-well erase is performed. In some cases, the NAND strings within a block may share a common well (e.g., a p-well). In a p-well erase, holes may be provided from the p-well in the substate below the NAND strings. In one embodiment, memory cells may be erased by raising the p-well to an erase voltage (e.g., 20 volts) for a sufficient period of time and grounding the word lines connected to memory cells to be erased. These erase bias conditions may cause electrons to be transferred from the charge-trapping layer or film 463 through the tunneling oxide 464, thereby lowering the threshold voltage of the memory cells within the selected block.

Another approach to erasing memory cells is to generate gate induced drain leakage (GIDL) current to charge up the NAND string channel. An erase enable voltage is applied to control gates of the memory cells, while maintaining the string channel potential to erase the memory cells. The GIDL current is generated by causing a drain-to-gate voltage at a select transistor (drain side and/or source side), in one embodiment. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel 465, thereby raising the potential of the channel 465. The other type of carriers, e.g., electrons, are extracted from the channel 465, in the direction of a bit line or in the direction of a source line, by an electric field. During erase, the holes may tunnel from the channel to a charge storage region 463 of memory cells and recombine with electrons there, to lower the threshold voltage of the memory cells.

After steps 604-610 are performed, an erase verify may be performed in step 612. The erase verify may apply for example VeV (See FIG. 5A or 5B) to each data WL in the erase group. If all memory cells in the erase group on a given NAND string have a Vt below VeV then the NAND string will conduct a significant current. Note that if only one tier is being erased then a pass voltage may be applied to word lines in the tier that is not being erased. The pass voltage is a voltage having sufficient magnitude to be above the respective Vts of the memory cells in the tier not being erased. Step 614 is a determination of whether erase is complete. In an embodiment, the storage system 100 will count the number of NAND strings that have not yet passed erase. In an embodiment, if the number is below an allowed number, then the erase is allowed to pass. If erase has passed then the process 600 completes with a status of pass in step 616. If erase has not yet passed then a determination may be made in step 618 of whether the loop counter has exceeded the maximum. In one embodiment, the erase process is allowed a certain number of loops to complete. If the loop count is less than the maximum then the process continues at step 620. In step 620, the magnitude of the erase voltage may optionally be increased. Also, the loop count is incremented. Then steps 604-618 are repeated. If erase does not pass within the allowed number this may be due to erase saturation. Step 622 includes mitigating erase saturation. Mitigating erase saturation may be used to get slower to erase NAND strings to erase while reducing or eliminating damage to faster to erase NAND strings.

In an embodiment, the erase saturation mitigation includes applying a programming voltage to memory cells that passed the erase while inhibiting programming to memory cells that did not pass the erase. Then, an additional erase voltage may be applied to the erase group. More specifically, steps 604-612 may be performed again. If erase has still not passed, then the storage system 100 may perform the additional actions just described to continue on with the erase until erase has been completed. There may be another loop counter to limit how many times these additional actions are performed.

Figure 7A:
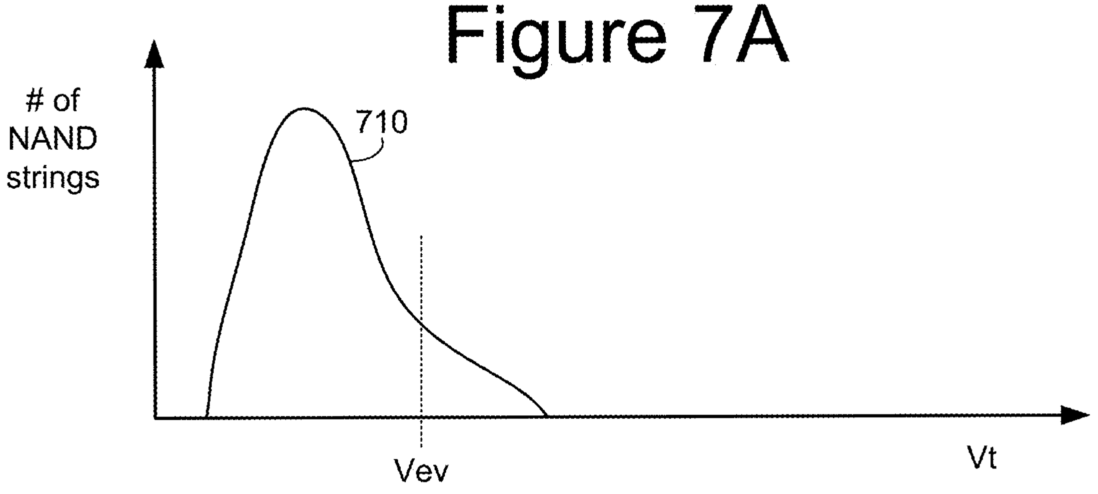
FIGS. 7A, 7B, and 7C show example Vt distributions during an embodiment of erase.
Figure 7B:
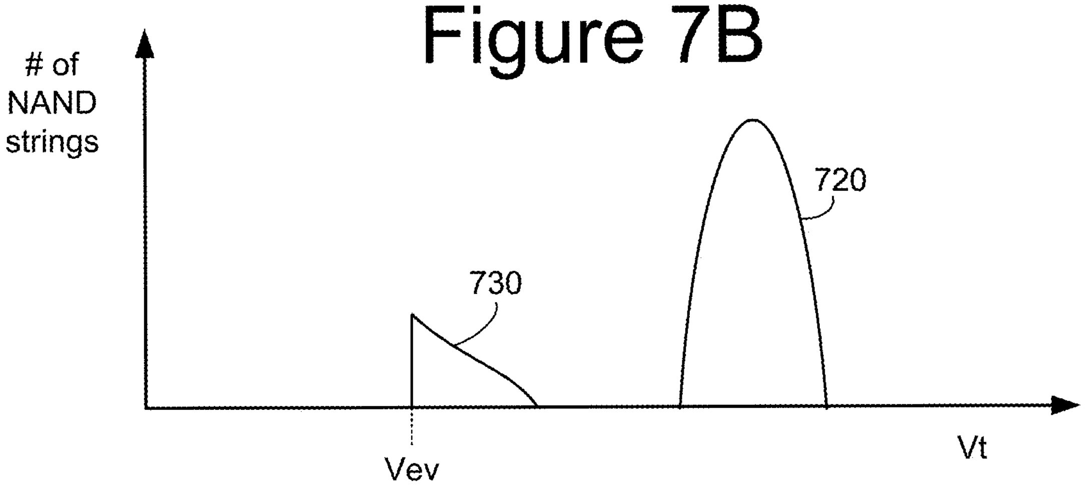
Figure 7C:
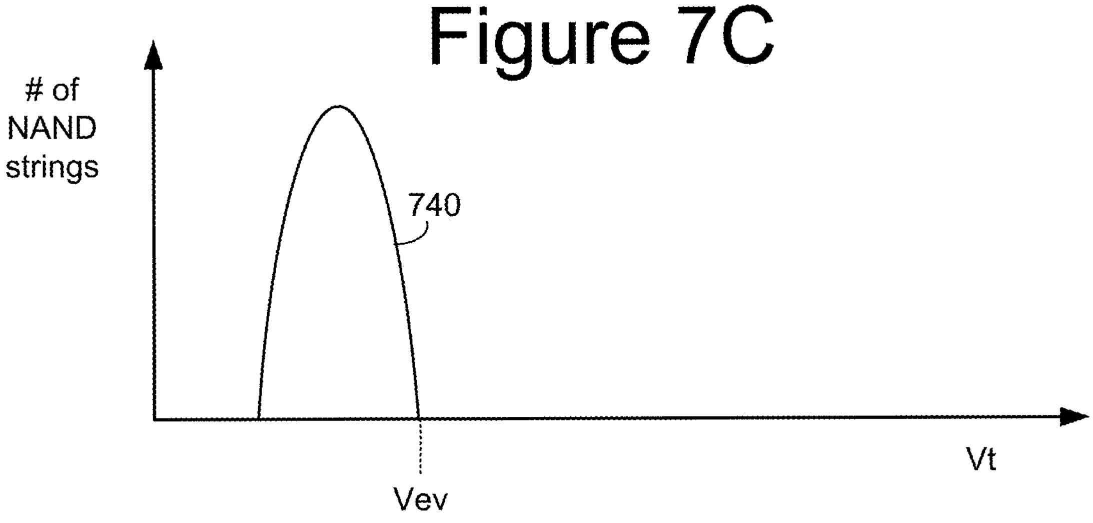

FIGS. 7A-7C depict Vt distributions during an embodiment of erase. The memory cells are in data Vt distributions prior to erase. The data Vt distributions could be SLC or MLC. If MLC, there could be, for example, four data Vt distributions, eight data Vt distributions, 16 data Vt distributions, or some other number of data Vt distributions. In each case, the data Vt distributions may include an erase Vt distribution and one or more programmed Vt distributions.

FIG. 7A shows an example Vt distribution after a number of erase loops. As an example, process 600 may have been performed to the point at which step 618 resulted in a conclusion that erase saturation mitigation should be performed. The erase verify reference of Vev is used to determine whether a NAND string passes erase. The term Vt of a NAND string may be used herein to refer to the highest Vt of a memory cell being erased on the NAND string, as that may be the determining factor in whether the NAND string passes erase. Vt distribution 710 shows that a large number of NAND strings have a Vt below Vev and therefore passed erase. However, a significant number of NAND strings have a Vt above Vev and therefore did not pass erase. The Vt of the slower to erase NAND strings might not drop very much in response to an additional erase pulse (even if higher in magnitude than the previous erase pulse). For example, an additional erase pulse that is 0.4V higher than the previous erase pulse might only drop the Vt of a slow to erase NAND string by about 0.1V. The term "erase saturation" may be used to refer to a slow to erase NAND string that does not respond much to the erase pulse.

Note that in some embodiments, even if a small number of the NAND strings fail to pass erase the erase process is allowed to end with a status of pass. However, in the example in FIG. 7A more NAND strings than this allowed number have not passed erase. Thus, even if the number of the NAND strings that are allowed to fail erase is relaxed somewhat (i.e., made higher) there may still be too many NAND strings failing erase such that the erase still fails. Moreover, simply increasing the number of erase loops may damage the memory cells on the faster to erase NAND strings.

A factor in the Vt distribution in FIG. 7A may be the age of the storage system and/or the number of program/erase cycles of the block. For example, over time there may be some charge accumulation in the memory cell film. This charge accumulation may slow the erase speed. However, physical differences between NAND strings, such as differences in the thickness of the memory cell films, can result is significant differences in the impact of this charge accumulation and therefore significant differences in the erase speeds on different NAND strings. Thus, note that the number of NAND strings in the region in FIG. 7A above Vev can become worse over time. Moreover, there could be significant block-to-block variation (for the same number of program/erase cycles) of the number of NAND strings in the region in FIG. 7A above Vev.

Also note that for the slower to erase NAND strings, the higher Vt may apply in general to all, or at least most, memory cells on the NAND string. For example, the average Vt of memory cells on a slow to erase NAND string may be higher than the average Vt on the faster to erase NAND strings (after a number of erase loops). Thus, a slow to erase NAND string is not necessarily due to one slow to erase memory cell on that NAND string.

Another possible factor in the shape of the Vt distribution 710 in FIG. 7A is that memory cells that were in a higher Vt state prior to erase may need more erase pulses to pass erase. For example, memory cells in the G-state (see FIG. 5B) may take more erase pulses to get below Vev than memory cells in the lower Vt states.

As mentioned above, if the erase fails to pass after a pre-determined number of erase loops, in one embodiment, the storage system 100 will "program" memory cells on NAND strings that passed erase. Here to "program" the memory cells means to increase the Vt of the memory cells by applying a program voltage having the opposite polarity of the erase voltage. Thus, for NAND cells, the erase voltage may be above 20V to the cell channel and about 0V to the cell's control gate. The program could be about 20V to the cell's control gate and about 0V to the cell channel. These are example magnitudes for the voltages. In some embodiments, the magnitude of the program voltage is lower than the magnitude of the erase voltage. The "programming" action to increase the Vt of the memory cells may include applying a single program pulse to word lines connected to the memory cells. Also, bit line voltages may be established to either enable or inhibit programming of memory cells on NAND strings connected to the respective bit lines.

FIG. 7B shows example Vt distributions after applying the programming to the memory cells on the NAND strings that passed erase. Also, memory cells on the NAND strings that did not pass erase are inhibited from programming. Vt distribution 720 shows the increase in Vt of the NAND strings that had a Vt below Vev. There is no need to perform any verification of the threshold voltage of the memory cells on those NAND strings. However, optionally a verification can be performed similar to a program verify, but the voltage level is not necessarily at any of the levels normally used to verify programing to a specific data state. Thus, it will be understood that the term "programming" in this context does not mean to target a specific data state for the memory cells. Vt distribution 730 shows that there is no change in Vt of the NAND strings that did not pass erase, as they were inhibited from programming.

After increasing the Vts of the NAND strings that passed erase, one or more additional erase pulses are applied to the group of NAND strings. This includes both the NAND strings that passed erase and those that did not. Thus, this includes both the NAND strings in Vt distribution 720 and those in Vt distribution 730. FIG. 7C shows an example Vt distribution after applying another erase voltage. For example, steps 604-610 in process 600 could be performed. In this example, Vt distribution 740 shows that all NAND strings now have a Vt below Vev and have passed erase. Therefore, the erase procedure has completed successfully. Moreover, Vt distribution 740 is relatively narrow and is uniform. In some cases, there may still be some NAND strings that have not passed erase in which case the "programming" described in connection with FIG. 7B could be performed on the NAND strings that have now passed erase.

Figure 8:
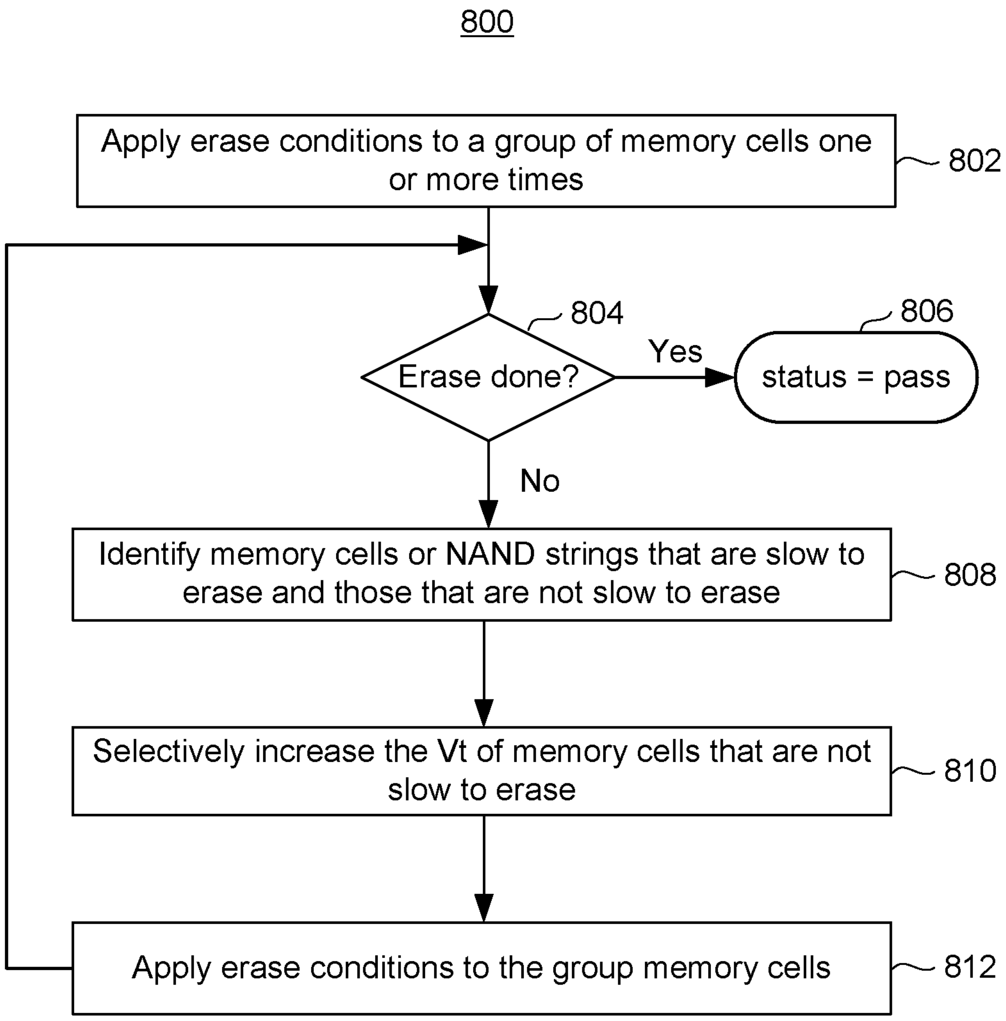
FIG. 8 is a flowchart of one embodiment of a process of erasing memory cells.

FIG. 8 is a flowchart of one embodiment of a process 800 of erasing memory cells. In an embodiment, the process is used to erase NAND memory cells; however, the process 800 is not limited to NAND. The process may be used to erase an entire block of memory cells or a sub-block. In one embodiment, the sub-blocks is based on tiers in a 3D memory structure. In one embodiment, the sub-blocks is based on select lines in a block. For example, the SGD lines may be used to select the sub-blocks. The process may be performed by one or more control circuits that may include, but are not limited to, system control logic 260, column control circuitry 210, and row control circuitry 220.

Step 802 includes applying erase conditions to a group of memory cells one or more times. The erase conditions include an erase voltage and may include other voltages. In one embodiment, steps 604-610 are performed one or more times. Other voltages may also be applied during step 802. For example, if only the upper tier 421 is being erased then a voltage that inhibits erase may be applied to the word lines in the lower tier 423. Step 802 may include performing a number of erase loops. The number of erase loops could be predetermined such as 4, 6, or some other number. This predetermined number could change depending on the number of program/erase cycles of the block. Thus, predetermined means that the number of erase loops is determined prior to the start of the erase process.

After step 802 a determination may be made whether erase has completed. In one embodiment, steps 612-614 of process 600 are performed. If erase has completed, then the process 800 completes in step 806 with a status of pass. If the erase has not yet completed, then process continues at step 808. Note that in many cases it will not be necessary to perform steps 808-812 due to the erase process ending successfully after step 802. Steps 808-812 are one embodiment of erase saturation mitigation and may be performed in one embodiment of step 622 of process 600.

FIG. 7A depicts one example of a NAND string Vt distribution 710 after applying the erase conditions to the group of memory cells one or more times in which case the erase did not pass. Step 808 includes identifying memory cells that are slow to erase and those that are not slow to erase. In an embodiment, step 808 includes identifying NAND strings that passed erase and NAND strings that did not pass erase. The memory cells that are slow to erase are those that were undergoing erase on the NAND strings that did not pass erase. The memory cells that are not slow to erase are those that were undergoing erase on the NAND strings that did pass erase. In one embodiment, Vev applied to word lines to identify NAND strings that passed erase and NAND strings that did not pass erase. However, another reference voltage could be used to identify the fast and slow to erase NAND strings. For example, whereas Vev might be used to verify whether NAND strings passed erase a higher or lower voltage could be used to determine which NAND strings were fast and slow to erase.

Step 810 includes selectively increasing the Vt of memory cells that are not slow to erase. Thus, step 810 may include selectively increasing the Vt of memory cells on the NAND strings that passed erase. Selectively increasing the Vt of memory cells on the NAND strings that passed erase means to increase the Vt of memory cells on the NAND strings that passed erase while inhibiting Vt increase of all other memory cells in the block. FIG. 7B depicts one example that shows the increase in Vt in Vt distribution 720 relative to the portion of Vt distribution 710 below Vev in FIG. 7A. FIG. 7B depicts one example that shows the inhibition of Vt increase in Vt distribution 730 relative to the portion of Vt distribution 710 above Vev in FIG. 7A.

Step 812 includes applying erase conditions to the group of memory cells after the selective increase of Vt. The erase conditions may be similar to those in step 802. However, only one loop of steps 604-610 needs to be performed. After step 812 a determination may be made in step 804 whether erase has completed. If needed, steps 808-812 may again be performed. In some embodiments, there is a limit to the number of times steps 808-812 may be performed.

Figure 9:
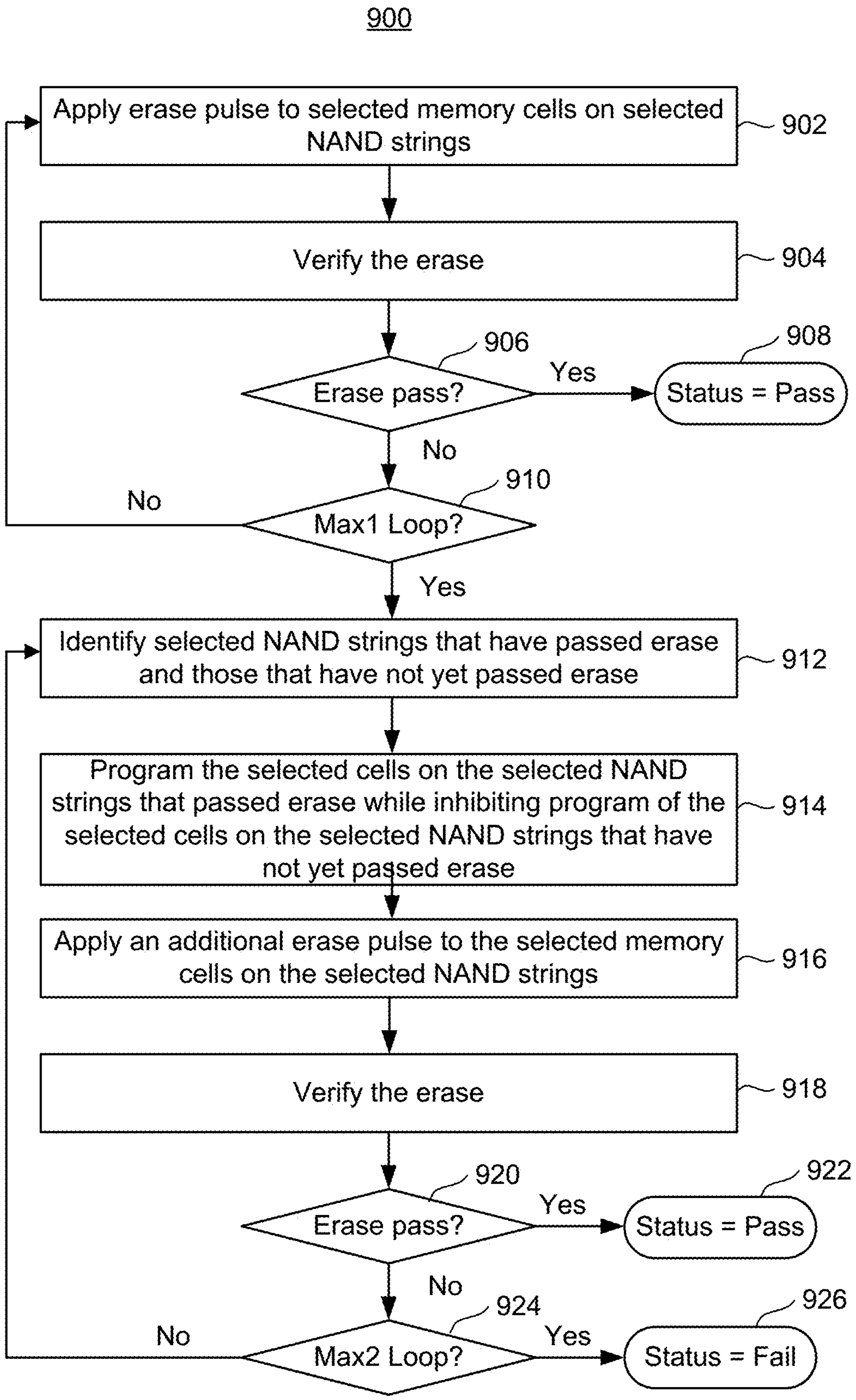
FIG. 9 is a flowchart that shows further details of one embodiment of a process of erasing memory cells in a selected block.

FIG. 9 is a flowchart that shows further details of one embodiment of a process 900 of erasing memory cells in a selected block. The process may be used to erase an entire selected block of memory cells or a sub-block in the selected block. In one embodiment, the sub-blocks are based on tiers in a 3D memory structure. In one embodiment, the sub-blocks are based on select lines in a block. For example, the SGD lines may be used to select/unselect the sub-blocks. The process may be performed by one or more control circuits that may include, but are not limited to, system control logic 260, column control circuitry 210, and row control circuitry 220.

Step 902 includes applying an erase pulse to selected memory cells on a group of selected NAND strings. In the erase process 900 the term "selected memory cells" refers to the set of memory cells that are selected for erase. In some cases all memory cells on a NAND string are selected for erase. In some cases, only some of the memory cells on NAND string are selected for erase. In the erase process 900 the term "selected NAND strings" refers to NAND strings having at least one memory cell selected for erase. A NAND string in the selected block having no memory cell selected for erase is considered an unselected NAND string. In some cases all NAND strings in the selected block will be selected for erase. In some cases only a subset of NAND strings in the selected block, such as the NAND strings in a selected sub-block, are selected for erase. For example, the SGD lines may be used to select/unselect the NAND strings in such selected/unselected sub-blocks. Step 902 may include performing steps 604-610 of process 600. Other voltages may also be applied during step 902. For example, if only the upper tier 421 is being erased then a voltage that inhibits erase may be applied to the word lines in the lower tier 423.

Step 904 includes verifying the erase. In an embodiment, Vev is applied to the word lines that are connected to the memory cells under erase. If only one tier is being erased, then Vev may be applied to just the tier under erase with a pass voltage applied to word lines in any tier not being erased. Step 906 includes a determination of whether erase has passed. In an embodiment, erase has passed if all but a pre-determined number of the selected NAND strings passed erase verify. If erase has completed, then the process 900 completes in step 908 with a status of pass. If the erase has not yet completed, then in step 910 a determination is made whether a loop count exceeds a first maximum (Max1). If this first maximum is not exceeded, then the process returns to step 902. If the this first maximum is exceeded, then the process goes to step 912.

Step 912 includes an identification of selected NAND strings that passed erase and those that did not pass erase. This identification may be made based on the last erase verification in step 904. Step 914 includes programming the selected memory cells on the selected NAND strings that passed erase while inhibiting from programming the selected memory cells on the selected NAND strings that did not pass erase. If a selected NAND string has unselected memory cells (those not selected for erase), then step 912 may include inhibiting from programming these unselected memory cells on the selected NAND strings. If the selected block has NAND strings that were not selected for erase, then step 912 may also include inhibiting programming of all memory cells on these unselected NAND strings. Note that step 912 is one embodiment of selectively increasing the Vt of memory cells that are not slow to erase.

Step 916 includes applying an additional erase pulse to the selected memory cells on the selected NAND strings. This step may be similar to step 902. Step 918 includes an erase verify, which may be similar to step 904. Step 920 includes a determination of whether erase has passed. In an embodiment, erase has passed if all but a pre-determined number of the selected NAND strings passed erase verify. If erase has completed, then the process 900 completes in step 922 with a status of pass. If the erase has not yet completed, then in step 924 a determination is made whether a loop count exceeds a second maximum (Max2). If this second maximum is not exceeded, then the process returns to step 912. If the second maximum is exceeded, then the process concludes in step 926 with a status of erase fail.

Figure 10:
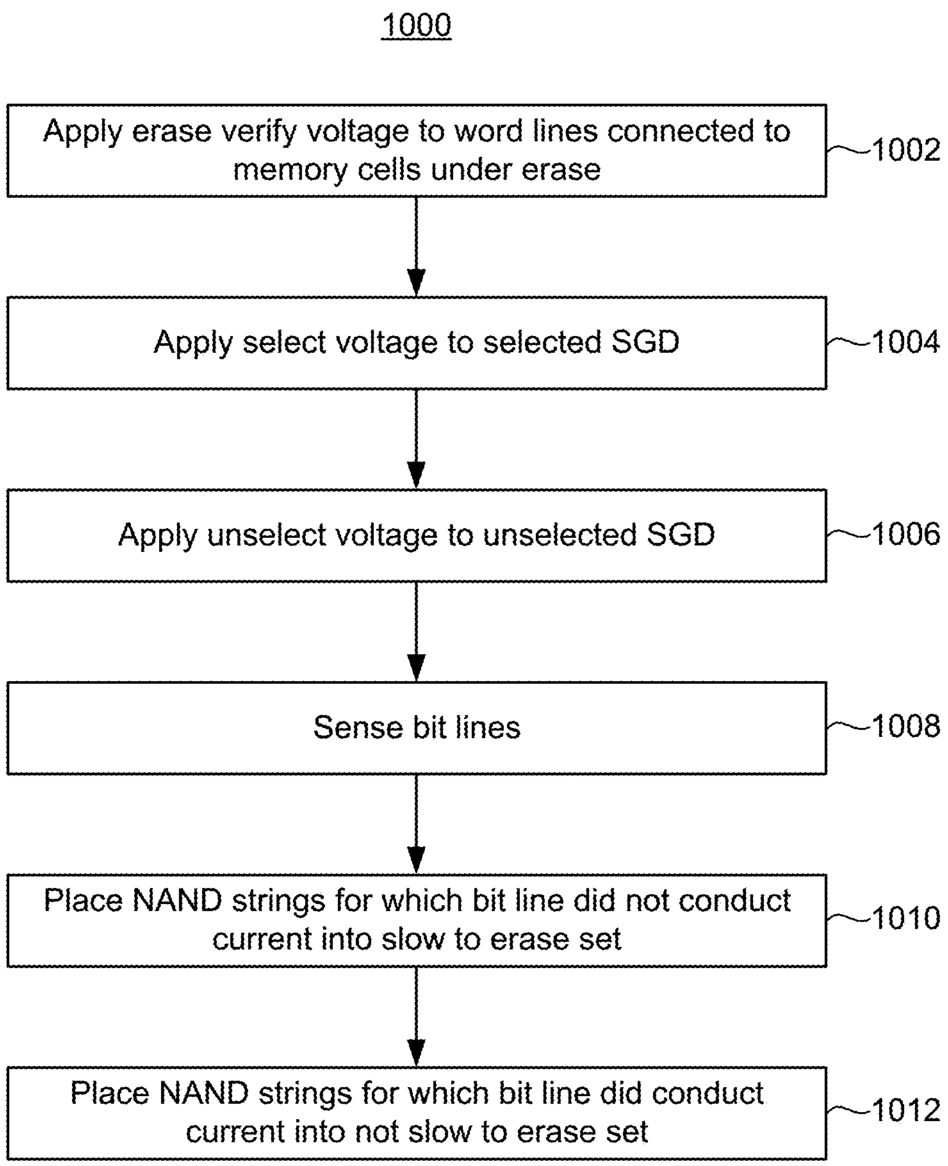
FIG. 10 is a flowchart of one embodiment of a process that shows further details of identifying memory cells that are slow to erase and memory cells that are not slow to erase.

FIG. 10 is a flowchart of one embodiment of a process 1000 that shows further details of identifying memory cells that are slow to erase and memory cells that are not slow to erase. Process 1000 describes a flow for one sub-block and may be repeated for other sub-blocks in the selected block. Step 1002 includes applying an erase verify voltage to word lines connected to memory cells under erase. In one embodiment, the erase verify voltage is applied to all data word lines in the selected block. However, in an embodiment such as erase of one tier, the erase verify voltage is only applied to word lines in the tier being erased. Other words lines in the block may have a pass voltage applied thereto. The pass voltage has a higher magnitude than the Vt of any of the memory cells connected to these other word lines.

Step 1004 includes applying a select voltage to the selected SGD. Step 1004 is used to select one of the sub-blocks. Step 1006 includes applying an unselect voltage to the unselected SGDs. In an embodiment, the select voltage has a higher magnitude than the unselect voltage. In an embodiment, the select voltage turns on the drain side select gates on the NAND strings in the selected sub-block. Therefore, the channel of each NAND string in the selected sub-block is connected to one of the bit lines. In an embodiment, the unselect voltage turns off the drain side select gates on the NAND strings in the unselected sub-blocks.

Step 1008 includes sensing the bit lines associated with the selected block. Step 1008 may sense the current in each respective bit line. In an embodiment, the R/W circuits 225 are used to sense the bit line current. Step 1010 includes placing NAND strings for which the bit line did not conduct a current into the slow to erase set. Step 1012 includes placing NAND strings for which the bit line did conduct a current into the not slow to erase set (e.g., faster to erase).

Figure 11:
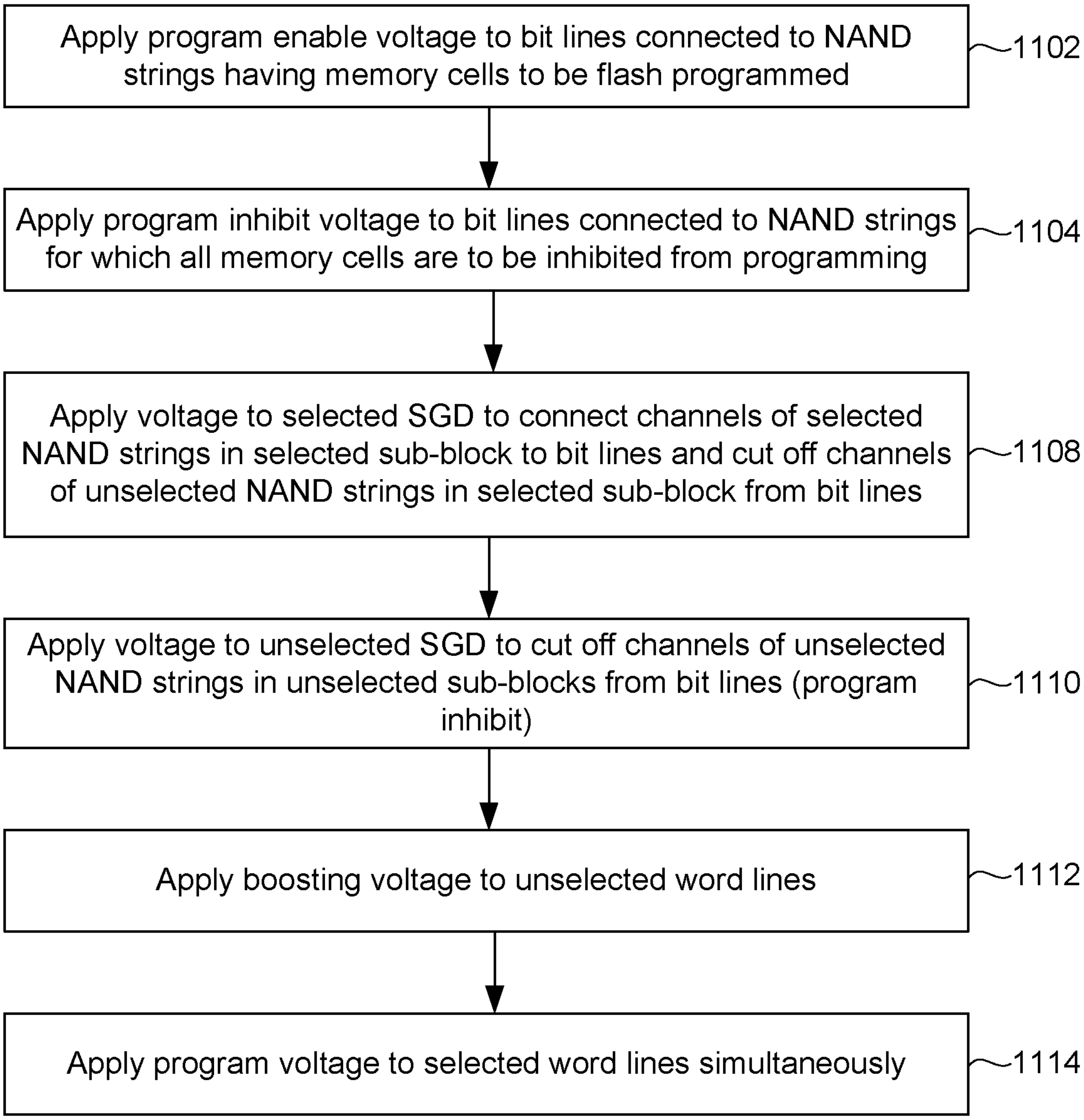
FIG. 11 is a flowchart of one embodiment of a process of flash programming memory cells on NAND strings.

FIG. 11 is a flowchart of one embodiment of a process 1100 of flash programming memory cells on NAND strings. Flash programming, as the term is defined herein, means to increase the Vt of more than one memory cell on a NAND string simultaneously. The Vts of the memory cells may be increased by applying a program pulse to the control gates of memory cells while applying a program enable voltage to the bit line(s) connected to the NAND string(s). Process 1100 is one technique for selective increasing the Vt of memory cells that may be used in step 810 of process 800.

Step 1102 includes applying a program enable voltage to bit lines connected to NAND strings having memory cells to be flash programmed. Flash programming will program at least two memory cells on each selected NAND string. Typically more than two memory cells on each selected NAND string. In process 1100 a "selected NAND string" refers to a NAND string for which memory cells are to be flash programmed. In process 1100 an "unselected NAND string" refers to a NAND string for which no memory cell is to be programmed. Step 1104 includes applying a program inhibit voltage to bit lines connected to unselected NAND strings for which all memory cells are to be inhibited from programming. In an embodiment, the program enable voltage has a lower magnitude than the program inhibit voltage. In an embodiment the program enable voltage has a magnitude of about 0V. In an embodiment the program inhibit voltage has a magnitude of about 2V to 2.5V.

Step 1108 includes applying an SGD select voltage to the selected SGD to connect channels of selected NAND strings in the selected sub-block to their respective bit lines and to cut off channels of unselected NAND strings in the selected sub-block from their respective bit lines. Note that it is the combination of the SGD select voltage and the bit line voltages that results in this behavior.

Step 1110 includes applying an SGD unselect voltage to the unselected SGDs to cut off the channels of unselected NAND strings in unselected sub-blocks from the bit lines. Note that in process 1100 all of the NAND strings in unselected sub-blocks are unselected NAND strings as no programming of memory cells occurs in any of the unselected sub-blocks. In an embodiment, the SGD select voltage has a higher magnitude than the SGD unselect voltage. An example magnitude for the SGD unselect voltage is 0V.

Step 1112 includes applying a boosting voltage to unselected word lines. An unselected word line in process 1100 is a word line for which no memory cell is to receive programming. Step 1114 includes applying a program voltage (Vpgm) to the selected word lines. A selected word line in process 1100 is a word line for which at least one memory cell is to receive programming. The selected word lines are connected to the memory cells for which flash programming is performed. The program voltage has a significantly higher magnitude than the boosting voltage. The program enable voltage will pass to the channels of the NAND strings in the selected sub-block that are connected to the bit lines having the program enable voltage applied thereto. Thus, memory cells to be flash programmed will have a control gate voltage of Vpgm and a channel voltage of about 0V, thereby resulting in an increase in Vt of those memory cells. The boosting voltage will cause the channels of the unselected NAND strings to couple up by capacitive coupling. The channel voltage of these unselected NAND strings will be high enough to inhibit programming of a memory cell even if Vpgm is applied to its control gate. Also, the boosting voltage has a sufficiently low magnitude such than any memory cell that is on a selected NAND string but is not to receive programming will be inhibited from programming even if the cell channel is at 0V. In one embodiment, the magnitude of Vpgm depends on what set of word lines are selected for flash programming. In one embodiment, the magnitude of Vpgm depends on the location (e.g., location along the z-axis) of the word lines that are selected for flash programming. Word lines at different levels of the memory structure could program at different speeds. The program speed refers to the amount of Vt increase that is achieved by the program pulse. Thus, the increase in Vt may depend on what would line is being programmed. In order to achieve a more uniform and more narrow erase distribution, the magnitude of Vpgm can account for the different programming speeds of the different word lines. In one embodiment, the magnitude of Vpgm depends on the programming speed of the word lines that are selected for flash programming.

Figure 12A:
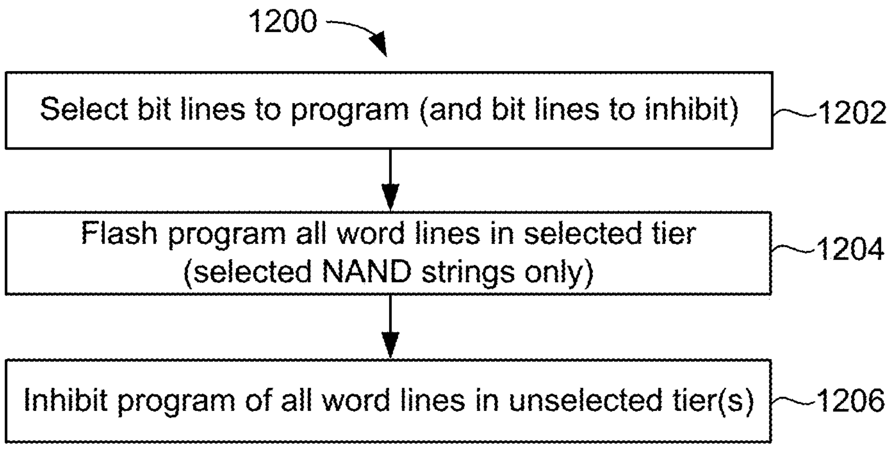
FIGS. 12A, 12B, 12C, and 12D depict flowcharts of embodiments of flash programming to increase the Vt of memory cells during erase.

FIGS. 12A-12D depict flowcharts of embodiments of flash programming to increase the Vt of memory cells during erase. Flash programming during erase is not limited to these embodiments. FIG. 12A is a flowchart of a process 1200 of flash programming in a tier of a selected block. Process 1200 may be used when the unit of erase is one tier of a block. Step 1202 includes selecting bit lines to program and bit lines to inhibit from programming. The determination may be based on the faster to erase and slower to erase NAND strings as described herein. Step 1204 includes flash programming all word lines in the selected tier. Note that only the selected NAND strings (those have memory cells to be flash programmed) will be flash programmed in step 1204. The unselected NAND strings (those having no memory cells to be flash programmed) will not be flash programmed in step 1204. Step 1206 includes inhibiting programming of all word lines in the unselected tier(s). In an embodiment, the program voltage is applied to all word lines in the selected tier and the boosting voltage is applied to all word lines in the unselected tier(s). The bit lines may be biased as described in connection with process 1100.

Figure 12B:
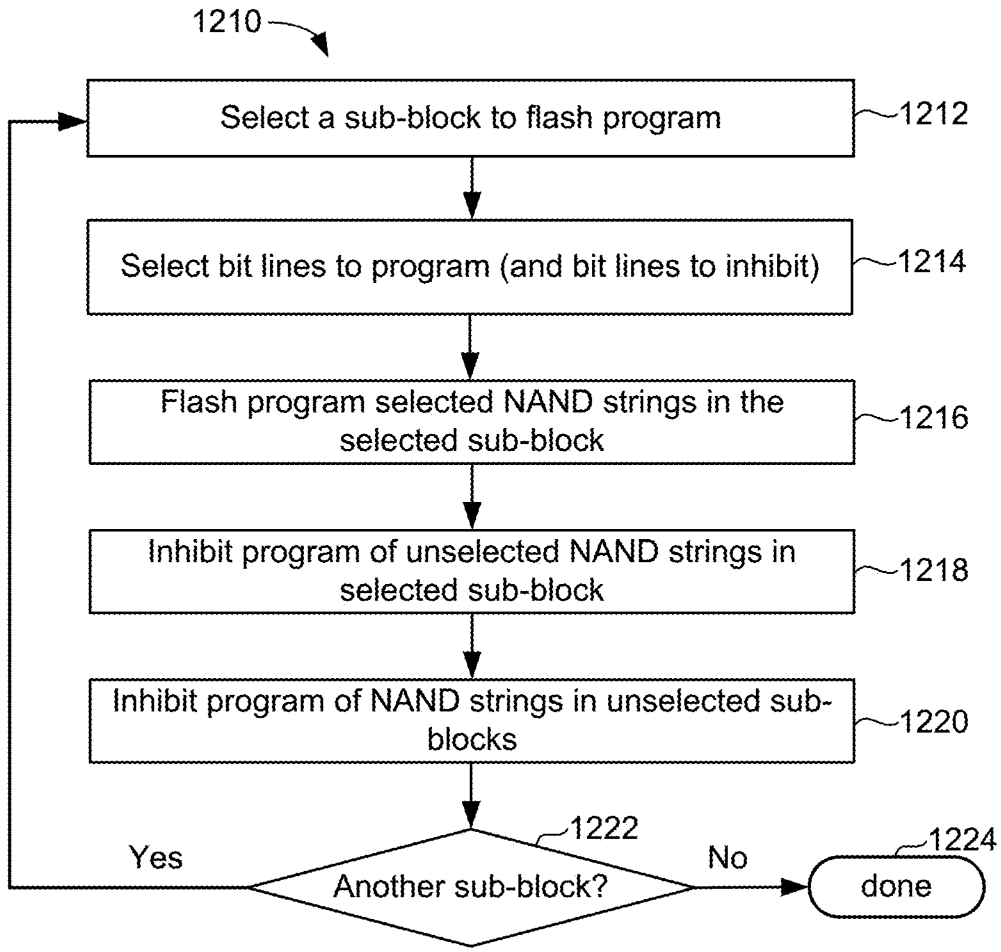
Figure 12C:
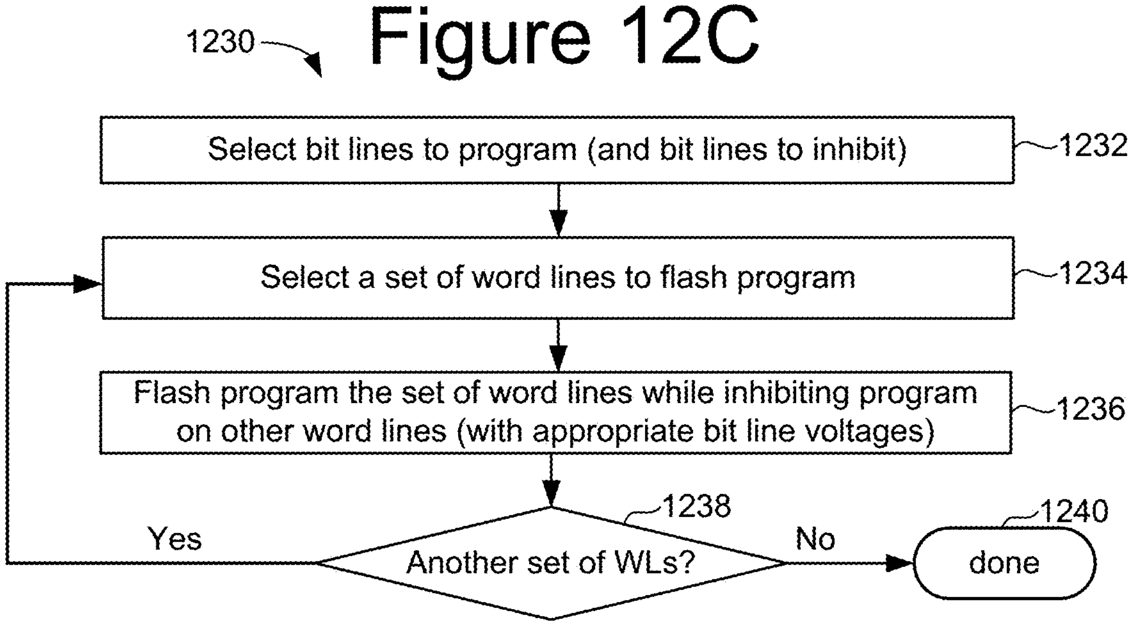

In some embodiments, there is more than one sub-block in the block. FIG. 12B describes one embodiment for handling multiple sub-blocks. FIG. 12B is a flowchart of a process 1210 of flash programming in a multiple sub-block of a selected block. Step 1212 includes selecting a sub-block to flash program. Step 1214 includes selecting bit lines to program and bit lines to inhibit from programming given the selected sub-block. The determination may be based on the faster to erase and slower to erase NAND strings as described herein. Step 1216 includes flash programming selected NAND strings in the selected sub-block. The selected NAND strings refers to the NAND strings in the selected sub-block having memory cells to be flash programmed. Step 1218 includes inhibiting programming of unselected NAND strings in the selected sub-block. These unselected NAND strings refer to the NAND strings in the selected sub-block having no memory cells to be flash programmed. Step 1220 includes inhibiting programming of unselected NAND strings in the unselected sub-blocks. These unselected NAND strings refer to all NAND strings in the unselected sub-blocks. Note that steps 1216-1220 are performed together. The bit line conditions and SGS line voltages may be established as described in process 1100. The word line voltages may also be established as described in process 1100 with Vpgm being applied to word lines connected to cells to be flash programmed and the boosting voltage applied to word lines for which no memory cell is to be programmed. Thus, steps 1216-1220 may be repeated to flash program other memory cells in the sub-block. FIG. 12C describes further details of an embodiment for flash programming different sets of word lines at different times. Step 1222 includes a determination of whether there is another sub-block to program. If not, then the process ends in step 1224. Otherwise, the process returns to step 1212 to select another sub-block to flash program.

FIG. 12C is a flowchart of a process 1230 of flash programming multiple sets of word lines at different times. Step 1232 includes selecting bit lines to program and bit lines to inhibit from programming. The determination may be based on the faster to erase and slower to erase NAND strings as described herein. Step 1234 includes selecting a set of word lines in the selected block to flash program. Step 1236 includes flash programming the set of word lines while inhibiting other word lines in the selected block from programming. Step 1236 includes applying the appropriate bit line voltages as previously discussed in connection with process 1100. The word line voltages may also be established as described in process 1100 with Vpgm being applied to word lines connected to cells to be flash programmed and the boosting voltage applied to word lines for which no memory cell is to be programmed. Step 1238 includes a determination of whether there is another set of word lines to flash program. If not, the process ends at step 1240. Otherwise, the process returns to step 1234 to select the next set of word lines to flash program. Note that process 1230 may be integrated into either process 1200 or 1210 in order to flash program sets of word lines at different times.

Figure 12D:
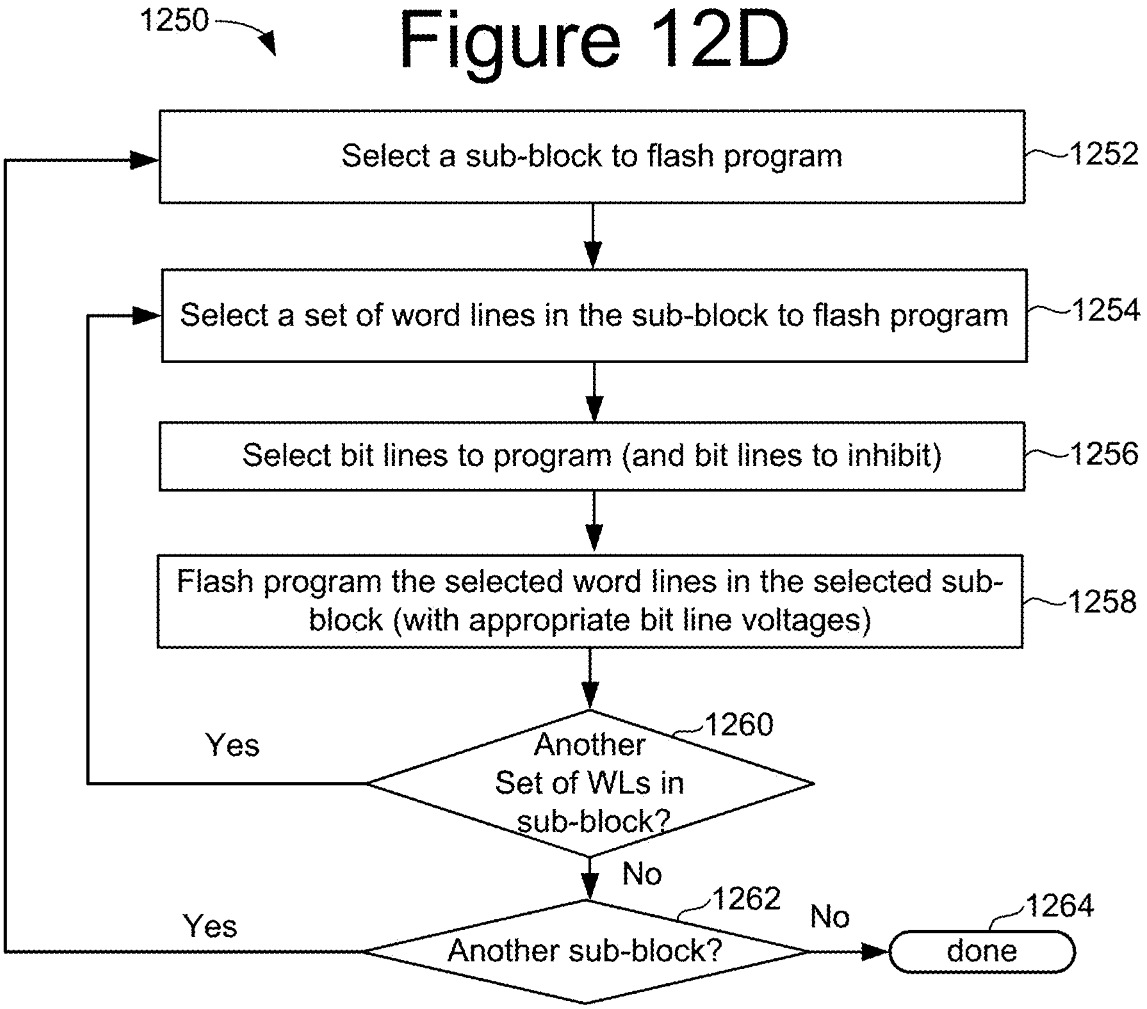

Process 1230 did not describe a case of having multiple sub-blocks but can be modified to handle multiple sub-blocks. FIG. 12D is a flowchart of a process 1250 of flash programming for which each flash programming is performed in a different sub-block/set of word lines combination. Step 1252 includes selecting a sub-block to flash program. Step 1254 includes selecting a set of word lines to flash program. Step 1256 includes selecting bit lines to program and bit lines to inhibit from programming given the selected sub-block. The determination may be based on the faster to erase and slower to erase NAND strings as described herein. Step 1258 includes flash programming the selected word line in the selected sub-block. Step 1258 includes applying the appropriate bit line voltages given the NAND strings to be programmed and those to be inhibited from programming. The bit line conditions and SGS line voltages may be established as described in process 1100. The word line voltages may also be established as described in process 1100 with Vpgm being applied to word lines connected to cells to be flash programmed and the boosting voltage applied to word lines for which no memory cell is to be programmed. Step 1260 includes a determination of whether there is another set of word lines to program in this sub-block. If so, the process selects the next set of word lines in step 1254. Otherwise, a determination is made in step 1262 of whether there is another sub-block to program. If so, the process returns to step 1252 to select the next sub-block. When all sub-blocks have been flash programmed the process ends at step 1264.

In view of the foregoing, an embodiment includes an apparatus comprising one or more control circuits configured to connect to a memory structure comprising non-volatile memory cells. The one or more control circuits are configured to apply erase conditions to a group of the memory cells one or more times. The one or more control circuits are configured to divide the group of the memory cells into a first set of the memory cells that were faster to erase and a second set of the memory cells that were slower to erase after applying the erase conditions the one or more times. The one or more control circuits are configured to selectively increase threshold voltages of the first set of the memory cells. The one or more control circuits are configured to apply additional erase conditions to the group of the memory cells after selectively increasing the threshold voltages of the first set of the memory cells.

In a further embodiment, the one or more control circuits are further configured to verify erase of the group of memory cells after applying the additional erase conditions to the group of the memory cells. The one or more control circuits are configured to provide a status of erase pass for the group of memory cells responsive to the group of memory cells passing erase after applying the additional erase conditions.

In a further embodiment, responsive to the group of memory cells not passing erase after applying the additional erase conditions, the one or more control circuits are further configured to perform the following one or more times until the group passes erase: identify a present set of the memory cells that passed erase and a present set of the memory cells that do not pass the erase after a most recent set of erase conditions were applied; selectively increase threshold voltages of the present set of the memory cells that passed erase after the most recent set of erase conditions were applied; and apply another set of erase conditions to the group of the memory cells after selectively increasing the threshold voltages of the present set of the memory cells that passed erase.

In a further embodiment, the one or more control circuits are configured to program the first set of the memory cells while inhibiting programming of the second set of the memory cells to selectively increase the threshold voltage of the first set of the memory cells.

In a further embodiment, the one or more control circuits are further configured to apply different program pulses to different subsets of the memory cells in the first set when programming the first set of the memory cells. The one or more control circuits are further configured to establish a magnitude for the different program pulses based on location of the subsets of the memory cells.

In a further embodiment, the selectively increasing the threshold voltage of first set of the memory cells comprises the one or more control circuits: applying a program pulse to control gates of the group of the memory cells; applying a program enable voltage to bit lines connected to NAND strings that have the first set of the memory cells; and applying a program inhibit voltage to bit lines connected to NAND strings that have the second set of the memory cells.

In a further embodiment, the one or more control circuits are further configured to apply an erase verify voltage to control gates of the group of the memory cells to identify the first set and the second set of the memory cells. Memory cells having a threshold voltage less than the erase verify voltage are placed into the first set. Memory cells having a threshold greater than the erase verify voltage are placed into the second set.

In a further embodiment, the group of the memory cells reside on a group of NAND strings. The memory structure comprises a group of word lines with each word line connecting to each NAND string in the group.

In a further embodiment, to selectively increase the threshold voltages of the first set of the memory cells the one or more control circuits are configured to perform the following for at least two sets of the group of the word lines: select a set of word lines connected to the NAND strings; and flash program the set of the word lines while inhibiting program of other word lines connected to the NAND strings.

In a further embodiment, the memory structure comprises blocks. Each block comprises a plurality of word lines and a plurality of NAND strings. Each word line in a block is connected to each NAND string in the block. Each block comprises a plurality of select lines configured to select a different sub-block in the block. The memory structure has a plurality of bit lines. Each NAND string is associated with a bit line. To selectively increase the threshold voltages of the first set of the memory cells the one or more control circuits are configured to perform the following: apply a voltage to one of the select lines to select a sub-block in a selected block; and flash program selected NAND strings in the selected sub-block while inhibiting programming of unselected NAND strings in the selected sub-block and while inhibiting programming of NAND strings in unselected sub-blocks of the selected block.

In a further embodiment, the apparatus comprises a first semiconductor die that comprises the memory structure and a second semiconductor die that comprises the one or more control circuits.

An embodiment comprises a method for erasing memory cells. The method comprises applying a plurality of erase pulses to selected memory cells on selected NAND strings. The method comprises determining which of the selected NAND strings passed erase after applying the plurality of erase pulses. The method comprises programming the selected memory cells on the selected NAND strings that passed erase while inhibiting from programming the selected memory cells on the selected NAND strings that did not pass erase after applying the plurality of erase pulses. The method comprises applying an additional erase pulse to the selected NAND strings after programming the selected memory cells on the selected NAND strings that passed erase.

One embodiment includes a non-volatile storage system comprising a memory structure comprising blocks and one or more control circuits in communication with the memory structure. Each block comprises a plurality of word lines and a plurality of NAND strings. Each word line in a block is connected to each NAND string in the block. The memory structure has a plurality of bit lines. Each NAND string is associated with a bit line. The one or more control circuits are configured to apply a plurality of erase voltages to a group of memory cells in a selected block. The group of memory cells are connected to a set of the word lines in the selected block. The one or more control circuits are configured to, responsive to a determination that first memory cells on a first set of NAND strings in the selected block passed erase and second memory cells on a second set of NAND strings in the selected block did not pass the erase after applying the plurality of erase voltages: program the first memory cells while inhibiting from programming all other memory cells in the selected block; and apply an additional erase voltage to the group of memory cells in the selected block after programming the first memory cells.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:

one or more control circuits configured to connect to a memory structure comprising NAND memory cells arranged as NAND strings, the one or more control circuits configured to:

apply erase conditions to a group of the NAND memory cells on a group of the NAND strings one or more times;

erase verify the group of the NAND memory cells to which the erase conditions were applied to determine, for each NAND string, whether the NAND string exhibited faster erase behavior or slower erase behavior;

divide, based on the erase verify, the group of the NAND strings into a first set of the NAND strings that were faster to erase and a second set of the NAND strings that were slower to erase after applying the erase conditions the one or more times, the first set of the NAND strings having a first sub-group of the group of the NAND memory cells, the second set of the NAND strings having a second sub-group of the group of the NAND memory cells;

selectively increase threshold voltages of the first sub-group of the NAND memory cells, including inhibiting the second sub-group of the NAND memory cells from changing threshold voltages; and apply additional erase conditions to the group of the NAND memory cells on the group of NAND strings after selectively increasing the threshold voltages of the first sub-group set of the NAND memory cells.

2. The apparatus of claim 1, wherein the one or more control circuits are further configured to:

verify erase of the group of the NAND memory cells on the group of NAND strings after applying the additional erase conditions to the group of the NAND memory cells on the group of NAND strings; and provide a status of erase pass for the group of the NAND memory cells on the group of NAND strings responsive to the group of the NAND strings passing erase after applying the additional erase conditions.

3. The apparatus of claim 2, wherein responsive to the group of NAND strings not passing erase after applying the additional erase conditions the one or more control circuits are further configured to perform the following one or more times until the group of NAND strings passes erase:

identify a present set of the NAND memory cells that passed erase and a present set of the NAND memory cells that do not pass the erase after a most recent set of erase conditions were applied;

selectively increase threshold voltages of the present set of the NAND memory cells that passed erase after the most recent set of erase conditions were applied; and apply another set of erase conditions to the group of the NAND memory cells after selectively increasing the threshold voltages of the present set of the NAND memory cells that passed erase.

4. The apparatus of claim 1, wherein the one or more control circuits are further configured to:

program the first sub-group of the NAND memory cells while inhibiting programming of the second sub-group of the NAND memory cells to selectively increase the threshold voltage of the first sub-group of the NAND memory cells.

5. The apparatus of claim 4, wherein the one or more control circuits are further configured to:

apply different program pulses to different subsets of the NAND memory cells in the first sub-group when programming the first sub-group of the NAND memory cells; and establish a magnitude for the different program pulses based on location of the subsets of the NAND memory cells.

6. The apparatus of claim 1, wherein selectively increasing the threshold voltage of first sub-group of the memory cells comprises the one or more control circuits:

applying a program pulse to control gates of the group of the memory cells on the group of NAND strings;

applying a program enable voltage to bit lines connected to NAND strings that have the first sub-group of the memory cells; and applying a program inhibit voltage to bit lines connected to NAND strings that have the second sub-group of the memory cells.

7. The apparatus of claim 1, wherein the one or more control circuits are further configured to:

apply an erase verify voltage to control gates of the group of the NAND memory cells on the group of NAND strings while applying a pass voltage to control gates of memory cells on the group of NAND strings in any tier not being erased to identify the first sub-group and the second sub-group of the memory cells, memory cells having a threshold voltage less than the erase verify voltage are placed into the first sub-group, memory cells having a threshold greater than the erase verify voltage are placed into the second sub-group.

8. The apparatus of claim 1, wherein:

the memory structure comprises a first group of word lines in a first tier and a second group of word lines in a second tier with each word line in both the first group of word lines and the second group of word lines connecting to each NAND string in the group, wherein the group of the NAND memory cells to which the erase conditions are applied reside in the first tier.

9. The apparatus of claim 8, wherein to selectively increase the threshold voltages of the first sub-group of the memory cells the one or more control circuits are configured to perform the following for at least two sets of the group of the word lines:

select a set of word lines connected to the group of NAND strings; and flash program the set of the word lines simultaneously while inhibiting program of other word lines connected to the group of NAND strings.

10. The apparatus of claim 1, wherein:

the memory structure comprising blocks, each block comprising a plurality of word lines and a plurality of NAND strings, each word line in a block connected to each NAND string in the block, each block comprising a plurality of select lines configured to select a different sub-block in the block, the memory structure having a plurality of bit lines, each NAND string associated with a bit line; and to selectively increase the threshold voltages of the first sub-group of the memory cells the one or more control circuits are configured to perform the following:

apply a voltage to one of the select lines to select a sub-block in a selected block; and flash program selected NAND strings in the selected sub-block, wherein the threshold voltages of more than one memory cell of each of the selected NAND strings are simultaneously increased, while inhibiting programming of unselected NAND strings in the selected sub-block and while inhibiting programming of NAND strings in un-selected sub-blocks of the selected block.

11. The apparatus of claim 1, wherein the apparatus further comprises:

a first semiconductor die that comprises the memory structure; and a second semiconductor die that comprises the one or more control circuits.

12. A method for erasing memory cells, the method comprising:

applying a plurality of erase pulses to selected memory cells on selected NAND strings;

determining which of the selected NAND strings passed erase after applying the plurality of erase pulses;

programming the selected memory cells on the selected NAND strings that passed erase while inhibiting from programming the selected memory cells on the selected NAND strings that did not pass erase after applying the plurality of erase pulses; and applying an additional erase pulse to the selected NAND strings after programming the selected memory cells on the selected NAND strings that passed erase.

13. The method of claim 12, further comprising:

verifying erase of the selected NAND strings after applying the additional erase pulse to the selected NAND strings;

responsive to the selected NAND strings passing erase after applying the additional erase pulse, provide a status of erase pass for the selected memory cells on the selected NAND strings; and responsive to the selected NAND strings not passing erase after applying the additional erase pulse, performing the following one or more times until the selected NAND strings pass erase:

determining which of the selected NAND strings passed erase after applying the most recent additional erase pulse;

programming selected memory cells on the selected NAND strings that passed erase while inhibiting from programming selected memory cells on the selected NAND strings that did not pass erase after applying the most recent additional erase pulse; and applying an additional erase pulse to the selected NAND strings after programming the selected memory cells on the selected NAND strings that passed erase.

14. The method of claim 12, wherein programming the selected memory cells on the selected NAND strings that passed erase while inhibiting from programming the selected memory cells on the selected NAND strings that did not pass erase after applying the plurality of erase pulses comprises:

applying a program enable voltage to bit lines connected to the selected NAND strings that passed erase; and applying a program inhibit voltage to bit lines connected to the selected NAND strings that did not pass erase;

applying a program pulse a group of selected word lines connected to the selected memory cells; and applying a boosting voltage to unselected word lines connected to the selected NAND strings.

15. The method of claim 12, wherein programming the selected memory cells on the selected NAND strings that passed erase while inhibiting from programming the selected memory cells on the selected NAND strings that did not pass erase after applying the most recent additional erase pulse comprises:

applying a single program pulse to the selected memory cells on the selected NAND strings that passed erase without verifying the programming.

16. A non-volatile storage system comprising:

a memory structure comprising blocks, each block comprising a plurality of word lines and a plurality of NAND strings, each word line in a block connected to each NAND string in the block, the memory structure having a plurality of bit lines, each NAND string associated with a bit line; and one or more control circuits in communication with the memory structure, wherein the one or more control circuits are configured to:

apply a plurality of erase voltages to a group of memory cells on selected NAND strings in a selected block, the group of memory cells connected to a set of the word lines in the selected block;

perform an erase verify of the group of the memory cells to determine which of the selected NAND strings passed erase; and responsive to a determination that a first set of NAND strings in the selected block passed erase and a second set of NAND strings in the selected block did not pass the erase after applying the plurality of erase voltages, the first set of the NAND strings having a first set of the group of the memory cells:

program the first set of the memory cells on the first set of NAND strings while inhibiting from programming all other memory cells in the selected block; and apply an additional erase voltage to the group of memory cells on the selected NAND strings in the selected block after programming the first memory cells.

17. The non-volatile storage system of claim 16, wherein the one or more control circuits are further configured to:

verify whether both the first set of NAND strings and the second set of NAND strings are erased after the additional erase voltage is applied to the group of memory cells;

report a status of erase passed for the group of memory cells in the selected block responsive to a determination that both the first set of NAND strings and the second set of NAND strings are erased after the additional erase voltage is applied; and perform the following until the group of memory cells are erased responsive to a determination that the group of memory cells are not erased after the additional erase voltage is applied:

program memory cells that passed erase after the most recent additional erase voltage is applied while inhibiting from programming memory cells all other memory cells in the selected block; and apply an additional erase voltage to the group of memory cells in the selected block.

18. The non-volatile storage system of claim 16, wherein to program the first set of the memory cells while inhibiting from programming all other memory cells in the selected block the one or more control circuits are further configured to:

flash program selected NAND strings in a selected sub-block in the selected block such that the threshold voltages of more than one memory cell of a NAND string are simultaneously increased;

inhibit programming of unselected NAND strings in the selected sub-block; and inhibit programming of NAND strings in unselected sub-block of the selected block.

19. The non-volatile storage system of claim 16, wherein to program the first memory cells while inhibiting from programming all other memory cells in the selected block the one or more control circuits are further configured to:

i) flash program a set of selected word lines simultaneously in the selected block;

ii) inhibit programming of unselected word lines in the selected block; and iii) repeat said i) and said ii) for one or more sets of selected word lines in the selected block.

20. The non-volatile storage system of claim 19, wherein the one or more control circuits are further configured to:

establish a magnitude for a program pulse for each respective set of selected word lines based on a programming speed of the respective set of selected word lines.

* * * * *